(12) United States Patent
Okada et al.

(10) Patent No.: US 8,096,744 B2
(45) Date of Patent: Jan. 17, 2012

(54) WAFER PROCESSING SYSTEM, WAFER PROCESSING METHOD, AND ION IMPLANTATION SYSTEM

(75) Inventors: Keiji Okada, Ehime (JP); Fumiaki Sato, Ehime (JP); Hiroaki Nakaoka, Ehime (JP)

(73) Assignee: Sen Corporation, An Shi and Axcelis Company, Tokyo (JP)

( * ) Notice: Subject to any disclaimer, the term of this patent is extended or adjusted under 35 U.S.C. 154(b) by 831 days.

(21) Appl. No.: 11/254,854

(22) Filed: Oct. 21, 2005

(65) Prior Publication Data

US 2006/0182532 A1 Aug. 17, 2006

(30) Foreign Application Priority Data

Nov. 30, 2004 (JP) ................................. 2004-346170

(51) Int. Cl.
*H01L 21/677* (2006.01)
(52) U.S. Cl. .................. 414/217; 414/222.12; 414/744.7
(58) Field of Classification Search ............... 414/217.1, 414/217, 221, 939, 806, 222.07, 222.08, 414/222.09, 222.12, 226.05, 744.7
See application file for complete search history.

(56) References Cited

U.S. PATENT DOCUMENTS

| | | | | |
|---|---|---|---|---|
| 5,664,254 A * | 9/1997 | Ohkura et al. | ................. | 396/612 |
| 6,002,840 A * | 12/1999 | Hofmeister | .................... | 700/245 |
| 6,679,675 B2 * | 1/2004 | Mitchell et al. | ............. | 414/744.3 |
| 6,748,293 B1 * | 6/2004 | Larsen | ........................... | 700/218 |
| 7,010,388 B2 * | 3/2006 | Mitchell et al. | ................ | 700/218 |
| 7,246,985 B2 * | 7/2007 | Ferrara | ........................... | 414/217 |
| 7,431,585 B2 * | 10/2008 | Zhao et al. | ..................... | 432/241 |
| 2002/0034433 A1 * | 3/2002 | Mitchell et al. | ............. | 414/744.6 |
| 2004/0228719 A1 | 11/2004 | Woodruff et al. | | |
| 2005/0232727 A1 * | 10/2005 | Ferrara | ........................... | 414/217 |
| 2006/0045664 A1 * | 3/2006 | Niewmierzycki et al. | ..... | 414/217 |
| 2007/0243049 A1 * | 10/2007 | Ferrara | ........................... | 414/217 |
| 2008/0228311 A1 * | 9/2008 | Shimizu et al. | ................ | 700/121 |

FOREIGN PATENT DOCUMENTS

| | | |
|---|---|---|
| EP | 0 604 066 A1 | 6/1994 |
| JP | 64-045543 A | 2/1989 |
| JP | 64-64231 A | 3/1989 |
| JP | 1-84428 U | 6/1989 |
| JP | 2000-12647 A | 1/2000 |
| JP | 2003-174069 A | 6/2003 |
| JP | 2004-289036 A | 10/2004 |
| JP | 2005-510870 A | 4/2005 |
| WO | WO-03/046958 A3 | 6/2003 |
| WO | WO 2004/086465 A2 | 10/2004 |

OTHER PUBLICATIONS

Machine Translation of Japanese Publication 2003-174069.*

* cited by examiner

*Primary Examiner* — Joshua Rudawitz
(74) *Attorney, Agent, or Firm* — Arent Fox, LLP

(57) ABSTRACT

Two load lock chambers having a load lock pedestal are provided adjacent to a vacuum process chamber through a vacuum intermediate chamber. A passage opening is provided between the vacuum process chamber and the vacuum intermediate chamber. Two wafer retaining arms are installed between a platen device in the vacuum process chamber and the vacuum intermediate chamber. The two wafer retaining arms are reciprocatingly movable between the corresponding load lock pedestals and the platen device while passing through the passage opening and crossing with an overpass each other at different levels. By retaining an unprocessed wafer by one of the wafer retaining arms and retaining a processed wafer by the other wafer retaining arm, transfer of the unprocessed wafer from one of the load lock pedestals to the platen device and transfer of the processed wafer from the platen device to the other load lock pedestal are performed simultaneously.

10 Claims, 18 Drawing Sheets

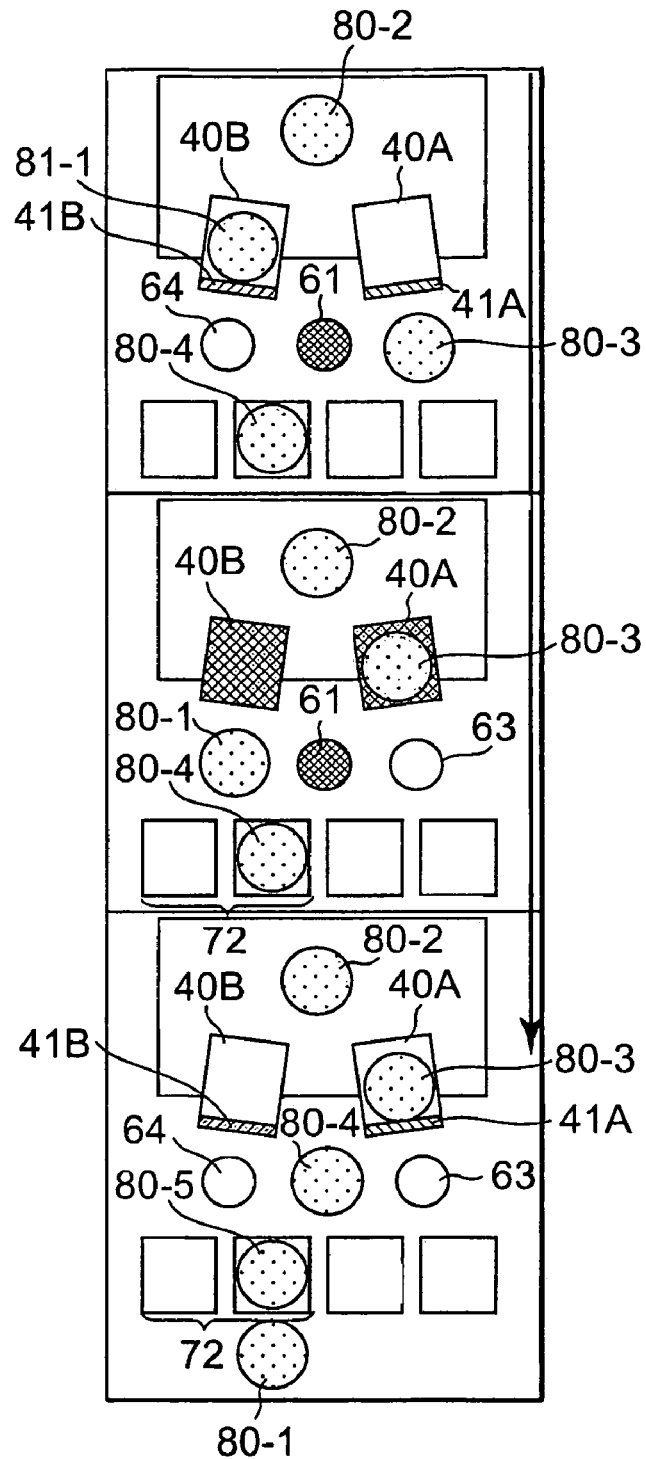

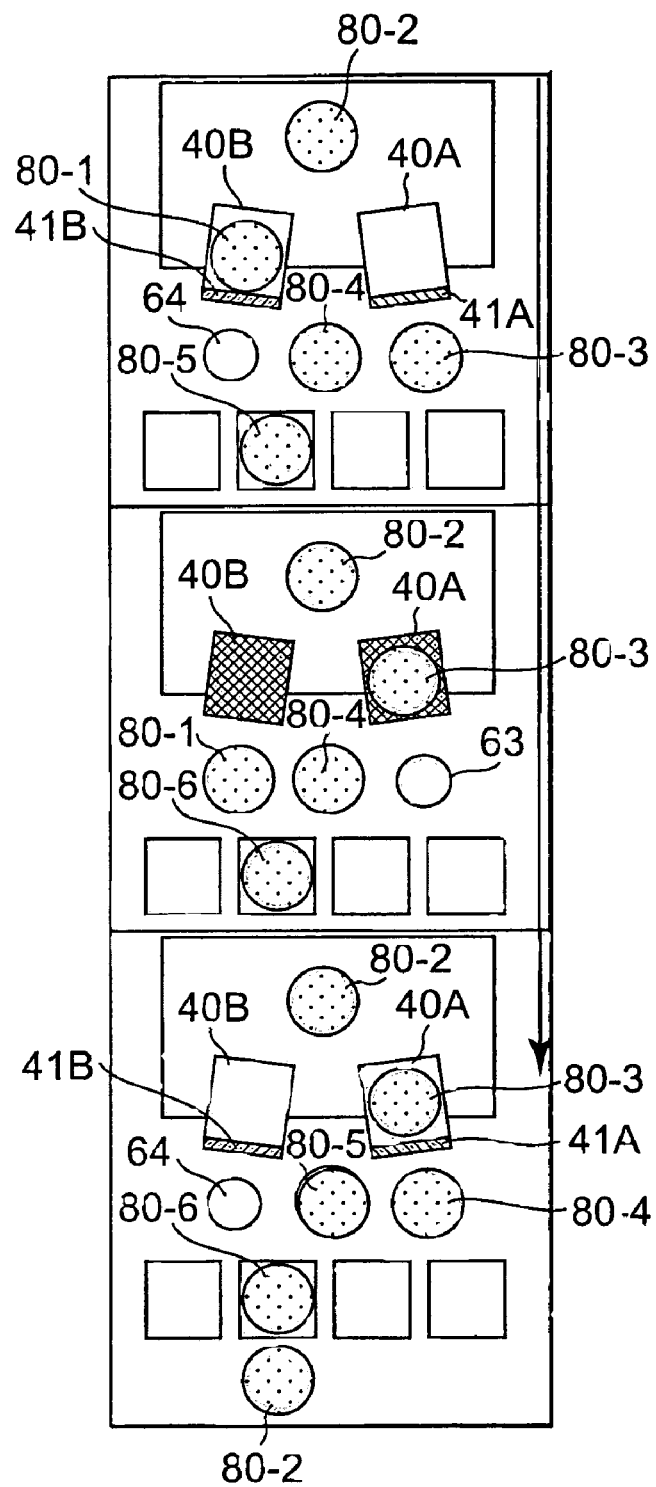

WAFER PROCESSING SYSTEM, WAFER PROCESSING METHOD, AND ION IMPLANTATION SYSTEM

This application claims priority to prior Japanese patent application JP 2004-346170, the disclosure of which is incorporated herein by reference.

BACKGROUND OF THE INVENTION

This invention relates to a wafer processing system and, in particular, relates to an improvement in transfer technique for transferring a wafer into an ion implantation chamber serving as an end station in an ion implantation system that is employed in, for example, the semiconductor manufacturing technology.

An ion implantation system comprises an ion source for generating ions. The ions generated in the ion source are extracted through an extraction electrode as an ion beam. Only a necessary ion species is selected from the extracted ion beam by the use of a mass analysis magnet device, a mass analysis slit, and soon. The ion beam composed of the selected ion species is implanted into a wafer in an ion implantation chamber through a deflector for scanning, acceleration/deceleration electrodes, and so on. A wafer processing system comprises the ion implantation chamber (vacuum process chamber). The wafer is transferred into the ion implantation chamber through a load lock chamber.

One example of the wafer processing system of this type will be described with reference to FIGS. 1 and 2.

FIG. 1 is a schematic structural diagram of a wafer transfer device 200 in a conventional wafer processing system. The wafer transfer device 200 is provided for an ion implantation system (not illustrated). In FIG. 1, only part of a section of a housing is illustrated using a break line with respect to a vacuum chamber 203 where ion implantation is applied to a wafer. The wafer transfer device 200 comprises a loading portion 206. The loading portion 206 serves to transfer an unprocessed wafer 205 into the vacuum chamber 203 through a load lock chamber 204 while transfer a processed wafer from the vacuum chamber 203.

The loading portion 206 has a platform 208 installed in the atmosphere. An aligner 212 is installed substantially at the center of the platform 208. The platform 208 further includes thereon first and second two robots 214 and 215 for wafer transfer with the aligner 212 interposed therebetween. The platform 208 further includes thereon two cassette stations 216 installed corresponding to the first robot 214 and two cassette stations 217 installed corresponding to the second robot 215.

The aligner 212 is a device for positioning a wafer in an angular direction suitable for ion implantation. In short, the wafer is formed with a positioning cut surface and notch. The aligner 212 comprises, in addition to a rotatable positioner, a sensor light-emitting plate and a sensor light-receiving plate for detecting the positioning cut surface and notch of the wafer. The aligner 212 detects the positioning cut surface and notch of the wafer by the use of the sensor light-emitting plate and the sensor light-receiving plate and carries out positioning of the wafer by the use of the positioner.

Since the first and second robots 214 and 215 have the same structure and function, description will be given of only the first robot 214. The first robot 214 is a three-axis arm robot and is installed at a predetermined position on the platform 208. The first robot 214 has an arm structure for implementing wafer transfer in and out with respect to the load lock chamber 204 and the cassette stations 216 and is capable of upward/downward movement, rotation, and forward/backward movement.

The cassette stations 216 and 217 have a detachable cassette 218 storing a number of wafers in a stacked fashion and have a structure that is rotatable to a position facing the corresponding robot 214, 215. When the corresponding robot 214, 215 takes out an unprocessed wafer from the cassette station 216, 217, the corresponding cassette station is turned by a predetermined angle so that an opening portion thereof faces the corresponding robot. Likewise, when the corresponding robot 214, 215 stores a processed wafer 205 into the cassette station 216, 217, the corresponding cassette station is turned by the predetermined angle so that the opening portion thereof faces the corresponding robot.

In this example, the two cassette stations 216 and the two cassette stations 217 are installed with respect to the corresponding first and second robots 214 and 215, respectively, on the side opposite to the load lock chamber 204 so that the four cassette stations are provided in total. It is possible to provide a required number of cassette stations for each robot and, therefore, as long as there is room remaining in the loading portion 206, the number of cassette stations may be more than four.

FIG. 2 shows an operation principle of the robots in a wafer transfer process. The wafer transfer by the operation of the robots starts with a preparation step (first step S1) where one unprocessed wafer 205' is taken out from a cassette A and placed on the aligner 212 by the first robot 214 in advance. The operation of this preparation step is carried out as a pre-stage when processing a first wafer. Subsequently, the following continuous operation is implemented.

In the continuous operation, the first robot 214 receives a processed wafer 205 from the load lock chamber 204 and stores it into the cassette A (second step S2). Then, the first robot 214 takes out an unprocessed wafer from the cassette A and places it on the aligner 212 (first step S1). On the other hand, the second robot 215 is in a standby state holding an unprocessed wafer that has already been subjected to a predetermined angular position adjustment on the aligner 212. Immediately after the processed wafer 205 has been taken out by the first robot 214, the second robot 215 transfers the unprocessed wafer 205' into the load lock chamber 204 before the first robot 214 places the next unprocessed wafer on the aligner 212 (third step S3).

When the first, second, and third steps have been sequentially implemented by the two robots so that all the wafers of the cassette A have been subjected to ion implantation and stored in the cassette A, then, wafers of a cassette B are processed. In this case, the operations of the first robot 214 and the second robot 215 are reversed.

Referring to FIG. 3, the load lock chamber 204 is divided into an upper load lock chamber 231 and a lower load lock chamber 232. The upper load lock chamber 231 is configured so as to allow arms of the first and second robots 214 and 215 to be inserted thereinto and have insert portions for those arms where lock doors 234 and 235 are provided, respectively. In the load lock chamber 204, there is provided a support table 241 having a wafer receiving platen 240 for placing thereon a wafer 205 or 205'. The support table 241 has a seal 243 provided along a peripheral edge thereof. A support shaft 242 is joined to a bottom portion of the support table 241. The seal 243 serves for sealing between the upper load lock chamber 231 and the lower load lock chamber 232 cooperatively with a partition wall 245 in the load lock chamber 204. The support shaft 242 passes through a bottom wall of the lower load lock chamber 232 and is coupled to a drive mechanism (not illustrated) arranged on a lower side of the load lock chamber 204 so as to be vertically movable.

Referring back to FIG. 2, the vacuum chamber 203 is provided therein with an I-shaped transfer arm 220 that is vertically movable and rotatable. The transfer arm 220 has both ends provided with generally C-shaped retaining portions 251 each for retaining a wafer. When an unprocessed wafer 205' placed on the wafer receiving platen 240 moves downward into the lower load lock chamber 232, the transfer arm 220 retains it by the use of one of the retaining portions 251 and turns at 180 degrees to thereby move the unprocessed wafer 205' to the ion beam implantation side. Simultaneously with this, the other retaining portion 251 retains a processed wafer 205 on the ion beam implantation side and turns at 180 degrees to thereby place it on the wafer receiving platen 240. Then, the wafer receiving platen 240 with the processed wafer 205 mounted thereon moves upward into the upper load lock chamber 231. Subsequently, the lock door 234 (or 235) is opened so that the wafer is taken out by the arm of the first (or second) robot 214 (or 215). Naturally, when the lock door 234, 235 is opened and closed, the support table 241 surely performs sealing between the upper load lock chamber 231 and the lower load lock chamber 232.

The wafer transfer device as described above is disclosed in, for example, Japanese Unexamined Patent Application Publication (JP-A) 2000-12647.

However, there arises the following problem in the wafer processing system having the foregoing wafer transfer device that employs the single load lock chamber 204 having the two lock doors 234 and 235 and the single I-shaped transfer arm 220. An air vacuum exhaustion/ventilation time, particularly the vacuum exhaustion time, for the load lock chamber 204 is long as compared with a wafer processing time, i.e. an ion implantation time for a wafer. As a result, a standby time in the load lock chamber 204 is prolonged. Further, in the single load lock chamber 204 having the two lock doors 234 and 235, an open time of the two lock doors in total is long and therefore a loss time increases. Consequently, a throughput or processing capability as the wafer processing system is limited and, therefore, further improvement in processing capability is required.

SUMMARY OF THE INVENTION

This invention is to provide a wafer processing system and a wafer processing method that can improve the wafer processing capability.

This invention is also to provide an ion implantation system having such a wafer processing system.

A wafer processing system according to this invention is for processing a subject wafer retained by a platen device installed in a vacuum process chamber.

According to a first aspect of this invention, two load lock chambers each having a load lock pedestal are provided adjacent to the vacuum process chamber through a vacuum intermediate chamber and a passage opening is provided between the vacuum process chamber and the vacuum intermediate chamber. The two wafer retaining arms are installed between the platen device in the vacuum process chamber and the vacuum intermediate chamber so as to correspond to the two load lock chambers and the two wafer retaining arms are reciprocatingly movable between the corresponding load lock pedestals and the platen device while passing through the passage opening and crossing with an overpass each other at different levels. By retaining an unprocessed wafer by the use of one of the wafer retaining arms and retaining a processed wafer by the use of the other wafer retaining arm, transfer of the unprocessed wafer from one of the load lock pedestals to the platen device and transfer of the processed wafer from the platen device to the other load lock pedestal are performed simultaneously.

According to a second aspect of this invention, vacuum exhaustion and ventilation mechanisms are provided in each of the load lock chambers. By retaining an unprocessed wafer by the use of one of the wafer retaining arms and retaining a processed wafer by the use of the other wafer retaining arm, transfer of the unprocessed wafer from one of the load lock pedestals, being in a vacuum state, to the platen device and transfer of the processed wafer from the platen device to the other load lock pedestal being in a vacuum state are performed simultaneously.

In the wafer processing system according to the first and second aspects, it is preferable that each of the load lock chambers has a door member that is opened and closed when an unprocessed wafer or a processed wafer is taken in or out with the load lock chamber by wafer transfer robots. The load lock pedestal is a vertically movable load lock pedestal and has a lock plate serving for opening and closing between the subject load lock chamber and the vacuum intermediate chamber.

In the wafer processing system according to the first and second aspects, it is preferable that, while the load lock chambers are closed by the lock plates by upward movement of the load lock pedestals, the two wafer retaining arms are in a standby state in the vacuum intermediate chamber.

In the wafer processing system according to the first and second aspects, it is preferable that, in a process where one of the wafer retaining arms transfers an unprocessed wafer from the corresponding load lock pedestal to the platen device and the other wafer retaining arm transfers a processed wafer from the platen device to the corresponding load lock pedestal, vertical positions of the wafer retaining arms are kept at heights that do not interfere with each other. When the wafer retaining arms reciprocatingly move simultaneously with each other, the two wafer retaining arms cross each other at the different levels.

In the wafer processing system according to the first and second aspects, it is preferable that each of the wafer retaining arms reciprocatingly moves between the corresponding load lock pedestal and the platen device by making a rotational motion on a rotation shaft.

In the wafer processing system according to the first and second aspects, it is preferable that each of the wafer retaining arms receives the unprocessed wafer from the corresponding load lock pedestal or the processed wafer from the platen device when the subject wafer retaining arm moves from its lower limit position to its upper limit position in a center axis direction of the rotation shaft.

In the wafer processing system according to the first and second aspects, it may be that each of the wafer retaining arms delivers the unprocessed wafer to the platen device or the processed wafer to the corresponding load lock pedestal when the subject wafer retaining arm moves from its upper limit position to its lower limit position in a center axis direction of the rotation shaft.

In the wafer processing system according to the first and second aspects, it is preferable that the passage opening has a valid height that enables the wafer retaining arms to pass therethrough. Vertical crossing of the two wafer retaining arms is carried out in proximity to each other with a vertical interval therebetween. The two wafer retaining arms pass through the passage opening while crossing with an overpass each other at the different levels.

In the wafer processing system according to the first and second aspects, it is preferable that while the two load lock chambers are closed by the lock plates by upward movement of the load lock pedestals, respectively, the load lock chambers are changed in pressure from the vacuum state to an atmospheric pressure by the ventilation mechanisms, respectively. Then, by opening the door members, delivery of the unprocessed wafer to one of the load lock pedestals and reception of the processed wafer from the other load lock pedestal are simultaneously carried out by the wafer transfer robots, respectively.

In the wafer processing system according to the first and second aspects, it is preferable that the wafer retaining arms make inward rotational motions so as to face each other.

In the wafer processing system according to the first and second aspects, it may be that each of the wafer retaining arms reciprocatingly moves between the corresponding load lock pedestal and the platen device by making a linear motion by the use of a liner motion mechanism. In this case, also, it is preferable that the passage opening has a valid height that enables the wafer retaining arms to pass therethrough. Vertical crossing of the two wafer retaining arms is carried out in proximity to each other with a vertical interval therebetween. The wafer retaining arms pass through the passage opening while crossing with an overpass each other at the different levels. Furthermore, it is preferable that while the two load lock chambers are closed by the lock plates by upward movement of the load lock pedestals, respectively, the load lock chambers are changed in pressure from the vacuum state to an atmospheric pressure by the ventilation mechanisms, respectively. Then, by opening the door members, delivery of the unprocessed wafer to one of the load lock pedestals and reception of the processed wafer from the other load lock pedestal are simultaneously carried out by the wafer transfer robots, respectively.

It is preferable that, when receiving the processed wafer from the platen device and delivering the unprocessed wafer to the platen device, the wafer retaining arms reciprocatingly moves between the corresponding load lock pedestals and the platen device while crossing with an overpass each other at the different levels by making inward rotational motions on rotation shafts, respectively.

According to a third aspect of this invention, two load lock chambers each having a load lock pedestal are provided adjacent to a vacuum process chamber through a vacuum intermediate chamber and a passage opening is provided between the vacuum process chamber and the vacuum intermediate chamber. Two wafer retaining arms are installed between a platen device in the vacuum process chamber and the vacuum intermediate chamber so as to correspond to the two load lock chambers. The two wafer retaining arms pass through the passage opening while making mutually outward rotational motions and are reciprocatingly movable between the corresponding load lock pedestals and the platen device while crossing with an overpass each other at different levels when receiving a processed wafer from the platen device and delivering an unprocessed wafer to the platen device. By retaining the unprocessed wafer by the use of one of the wafer retaining arms and retaining the processed wafer by the use of the other wafer retaining arm, transfer of the unprocessed wafer from one of the load lock pedestals to the platen device and transfer of the processed wafer from the platen device to the other load lock pedestal are performed simultaneously.

In the wafer processing system according to the first, second, and third aspects, the system further comprises, outside the vacuum process chamber, two robots for wafer transfer installed corresponding to the two load lock chambers, an aligner for wafer positioning installed between the two robots, and at least one cassette station for accommodating wafers. One of the load lock chambers is exclusively used for transfer of an unprocessed wafer carried out by the corresponding one of the robots and the other load lock chamber is exclusively used for transfer of a processed wafer carried out by the corresponding other robot. Transfer of an unprocessed wafer to the aligner is alternately carried out by the one and other robots so that while the one robot transfers an unprocessed wafer to the one load lock chamber, the other robot transfers a next unprocessed wafer to the aligner and, while the other robot transfers a processed wafer from the other load lock chamber, stores the processed wafer into the cassette station, takes out a next unprocessed wafer from the cassette station, and transfers the next unprocessed wafer to the aligner, the one robot retains the next unprocessed wafer on the aligner and waits. While ion implantation is performed for an unprocessed wafer on the platen device, four unprocessed and processed wafers in total are present in a path of the aligner—the one load lock chamber—the one or other robot—the platen device—the other load lock chamber—the aligner.

According to a fourth aspect of this invention, a first, a second, and a third load lock chamber each having a load lock pedestal are provided adjacent to a vacuum process chamber through a vacuum intermediate chamber and a passage opening is provided between the vacuum process chamber and the vacuum intermediate chamber. The first and second load lock chambers are exclusively used for transfer-in of unprocessed wafers and the third load lock chamber is installed between the first and second load lock chambers and exclusively used for transfer-out of a processed wafer. The third load lock chamber has a door member that is opened and closed when a processed wafer is taken out. The load lock pedestal is a vertically movable load lock pedestal and has a lock plate serving for opening and closing between the third load lock chamber and the vacuum intermediate chamber. While one of wafer retaining arms transfers an unprocessed wafer from the corresponding load lock pedestal to the platen device, the other wafer retaining arm transfers a processed wafer from the platen device to the transfer-out dedicated load lock pedestal and, while the other wafer retaining arm transfers an unprocessed wafer from the corresponding load lock pedestal to the platen device, the one of wafer retaining arms transfers a processed wafer from the platen device to the transfer-out dedicated load lock pedestal.

In the wafer processing system according to the fourth aspect, the system may further comprises, outside the vacuum process chamber, at least one robot for wafer transfer and a plurality of cassette stations for accommodating unprocessed wafers and processed wafers. In this case, it is preferable that the at least one robot comprises an aligner for wafer positioning and is movable along the first to third load lock chambers so as to be capable of the transfer-in of the unprocessed wafers and the transfer-out of the processed wafer with respect to the transfer-in dedicated load lock chambers and the transfer-out dedicated load lock chamber.

In the wafer processing system according to the second aspect, it is preferable that the vacuum exhaustion and ventilation mechanisms of each load lock chamber are provided with slow rough vacuum exhaustion and slow atmosphere-opening ventilation mechanisms.

According to this invention, an ion implantation system comprising the wafer processing system according to any one of the first through the fourth aspests is provided.

According to this invention, a wafer processing method is further provided, whihc is for a wafer processing system that processes a subject wafer retained by a platen device installed in a vacuum process chamber.

The wafer processing method according to this invention comprises providing, adjacent to the vacuum process chamber, two load lock chambers each having a load lock pedestal and disposing, in the vacuum process chamber, two wafer retaining arms corresponding to the two load lock chambers. The method also comprises making the two wafer retaining arms reciprocatingly movable between the corresponding load lock pedestals and the platen device while crossing with an overpass each other at different levels. The method further comprises retaining an unprocessed wafer by the use of one of the wafer retaining arms and retaining a processed wafer by the use of the other wafer retaining arm, thereby parallelizing transfer of the unprocessed wafer from one of the load lock pedestals to the platen device and transfer of the processed wafer from the platen device to the other load lock pedestal.

In the wafer processing method according to this invention, the wafer processing system may further comprise, outside the vacuum process chamber, two robots for wafer transfer installed corresponding to the two load lock chambers, an aligner for wafer positioning installed between the two robots, and at least one cassette station for accommodating wafers. In this case, the method further comprise taking an unprocessed wafer into one of the load lock chambers by the use of the corresponding one of the robots and taking out a processed wafer from the other load lock chamber by the use of the corresponding other robot; and carrying out transfer of an unprocessed wafer to the aligner alternately by the one and other robots so that while the one robot transfers an unprocessed wafer to the one load lock chamber. The other robot transfers a next unprocessed wafer to the aligner and, while the other robot transfers a processed wafer from the other load lock chamber, stores the processed wafer into the cassette station, takes out a next unprocessed wafer from the cassette station, and transfers the next unprocessed wafer to the aligner, the one robot retains the next unprocessed wafer on the aligner and waits. While ion implantation is performed for an unprocessed wafer on the platen device, four unprocessed and processed wafers in total are present in a path of the aligner—the one load lock chamber—the one or other robot—the platen device—the other load lock chamber—the aligner.

BRIEF DESCRIPTION OF THE DRAWINGS

FIGS. 9A to 9G are diagrams for explaining, in sequence, the flow of wafer transfer processing operation implemented by the wafer processing system of this invention in the case of three-wafer transfer;

FIGS. 14A to 14G are diagrams for explaining a four-wafer transfer processing operation implemented by the wafer processing system of this invention;

DESCRIPTION OF THE PREFERRED EMBODIMENT

Figure 4A:
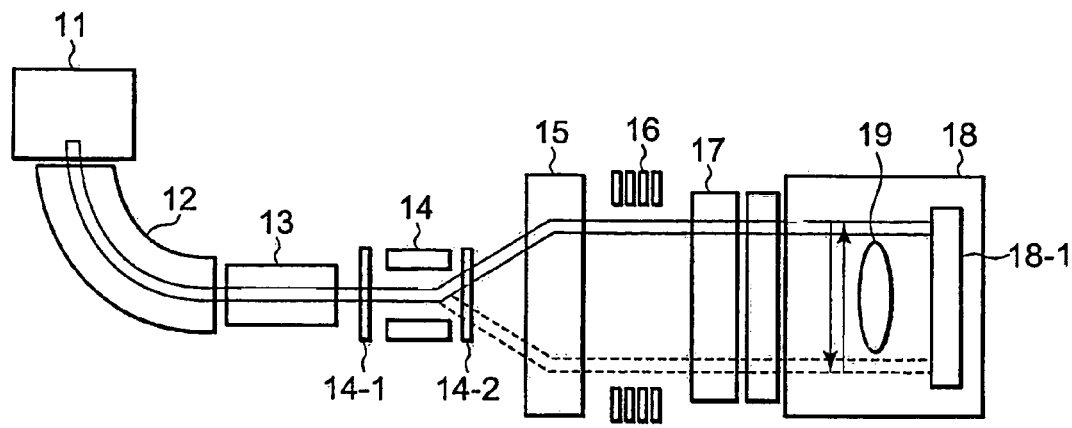
FIGS. 4A and 4B are a plan view and a side view, respectively, each showing a schematic structure of an ion implantation system where a wafer processing system according to this invention is applied.
Figure 4B:
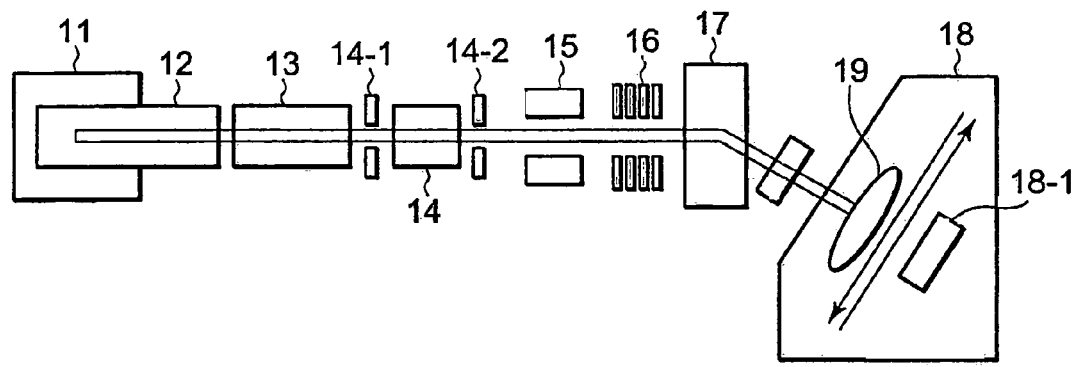

Referring to FIGS. 4A and 4B, description will be first given about an example wherein a wafer processing system according to this invention is employed. In this example, this invention is applied particularly to a single-wafer ion implantation system among beam processing systems each using a charged particle beam. FIGS. 4A and 4B are a plan view and a side view, respectively, showing a schematic structure of the single-wafer ion implantation system.

The illustrated ion implantation system comprises an ion source unit 11 (including ion source and extraction electrode), a mass analysis magnet device 12, a beam shaper 13, a deflector 14 for scanning, a P (Parallelizing)-lens 15, acceleration/deceleration electrodes (A/D columns) 16, an angular energy filter (AEF) 17, and a process chamber 18.

Figure 2:
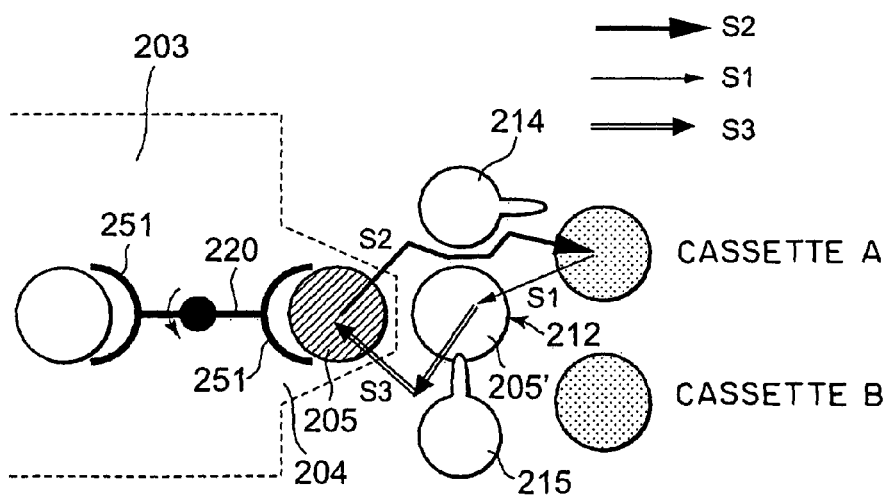
FIG. 2 is a diagram showing an operation principle of robots in a wafer transfer process implemented by the wafer transfer device shown in FIG. 1.
Figure 3:
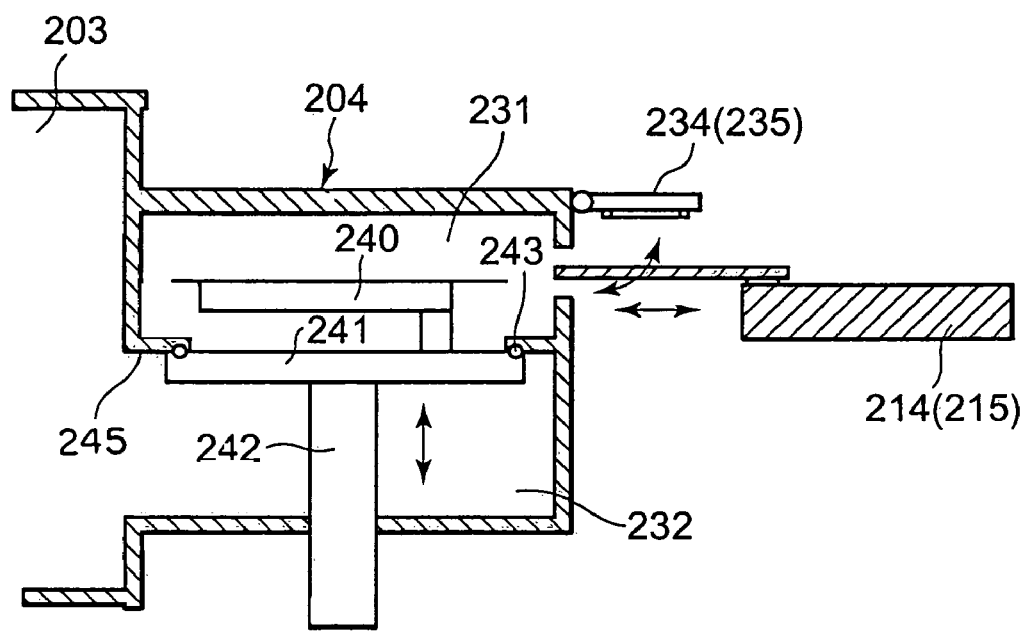
FIG. 3 is a sectional view for explaining a structure of a load lock chamber shown in FIG. 2.

In this ion implantation system, ions generated in the ion source unit 11 are extracted through the extraction electrode (not illustrated) as an ion beam (hereinafter referred to as a "beam"). The extracted beam is subjected to a mass analysis in the mass analysis magnet device 12 so that only a necessary ion species is selected. The beam composed of only the necessary ion species is shaped in cross-section by the beam shaper 13. The beam shaper 13 is formed by a Q (Quadrant or Quadrupole)-lens and so on. The beam having the shaped cross-section is deflected in an upward/downward direction in FIG. 2A by the deflector 14 for scanning. The deflector 14 has at least one shield electrode 14-1 and at least one shield electrode 14-2 that are installed near the deflector 14 on its upstream and downstream sides, respectively. Although deflection scan electrodes are used as the deflector 14 for scanning in this embodiment, a deflection scan magnet may be used in place of them.

The beam deflected by the deflector 14 for scanning is parallelized by the P-lens 15 formed by electrodes or a magnet so as to be parallel to an axis of a deflection angle of 0°. In FIG. 4A, a scan range by a reciprocal swinging beam by the deflector 14 is indicated by a thick black line and double broken lines. The beam from the P-lens 15 is accelerated or decelerated by one or more acceleration/deceleration electrodes 16 and sent to the angular energy filter 17. The angular energy filter 17 performs an analysis about energy of the beam to thereby select only an ion species having a necessary energy. As shown in FIG. 4B, only the selected ion species is deflected slightly downward in the angular energy filter 17. The beam composed of only the thus selected ion species is implanted into a wafer 19 that is a to-be-irradiated object introduced in the process chamber 18. The beam that is deviated from the wafer 19 is incident on a beam stopper 18-1 provided in the process chamber 18 so that energy thereof is consumed.

In FIG. 4A, arrows shown adjacent to the wafer 19 represent that the beam is deflected for scanning in directions of these arrows, while, in FIG. 4B, arrows shown adjacent to the wafer 19 represent that the wafer 19 is moved in directions of these arrows. Specifically, assuming that the beam is reciprocatingly deflected for scanning in, for example, x-axis directions, the wafer 19 is driven by a drive mechanism (not illustrated) so as to be reciprocated in y-axis directions perpendicular to the x-axis directions. This enables irradiation with the beam over the whole surface of the wafer 19.

In the manner as described above, in the ion implantation system shown in FIGS. 4A and 4B, a beam having an elliptical or oval continuous cross-section that is long in one direction can be obtained by deflection a beam having a circular cross-section or an elliptical or oval cross-section, and then bent at a uniform angle at any positions in a scan area thereof by the use of the angular energy filter serving as a later-stage energy analyzer, and finally can be implanted into the wafer 19.

The path of the beam is all sealed from the air and maintained in a high-vacuum state and, as will be described hereinbelow, the wafer 19 is mounted in a vacuum process chamber of the wafer processing system.

Figure 5:
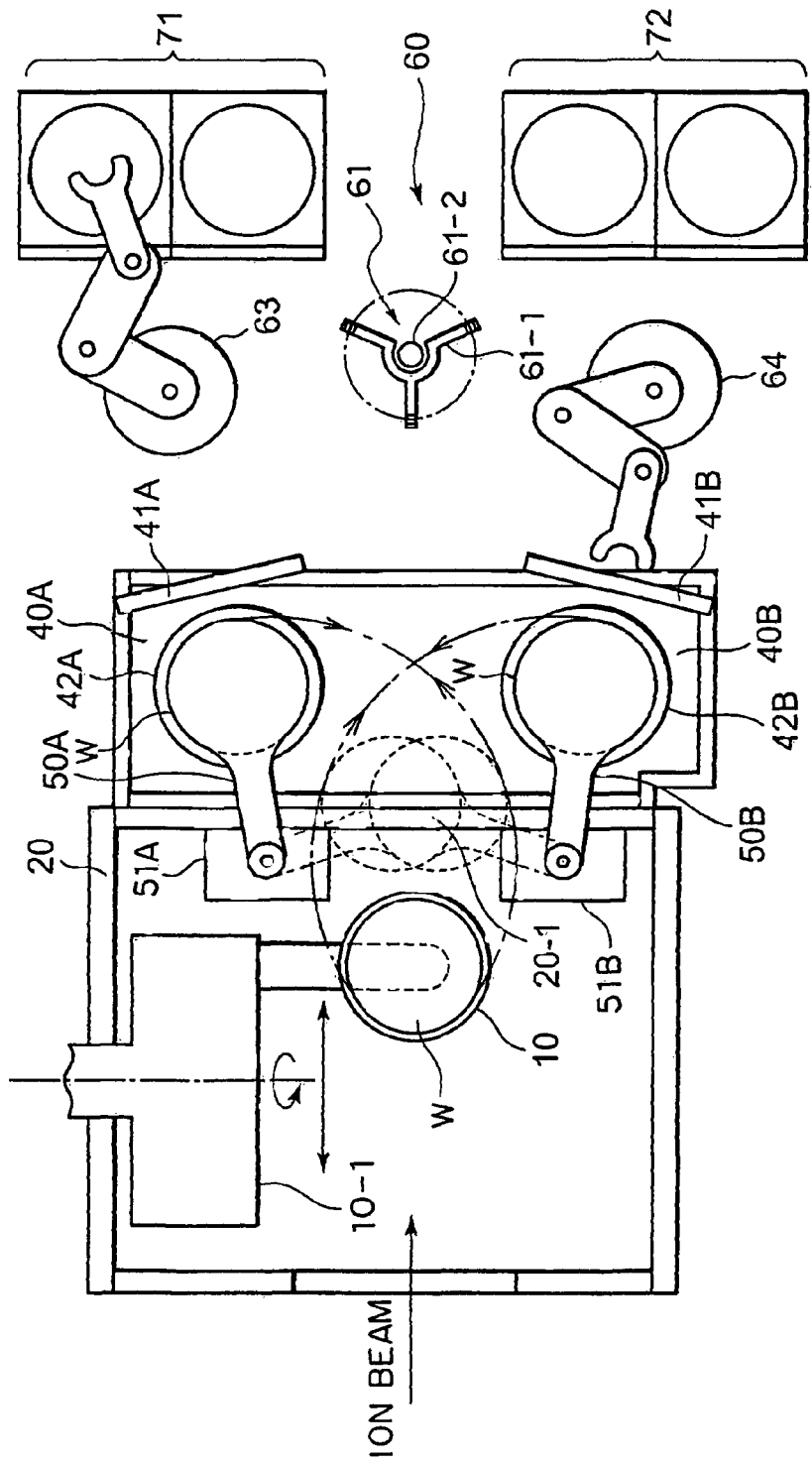
FIG. 5 is a partly sectional plan view showing a schematic structure of a single-wafer type wafer processing system according to this invention.
Figure 6:
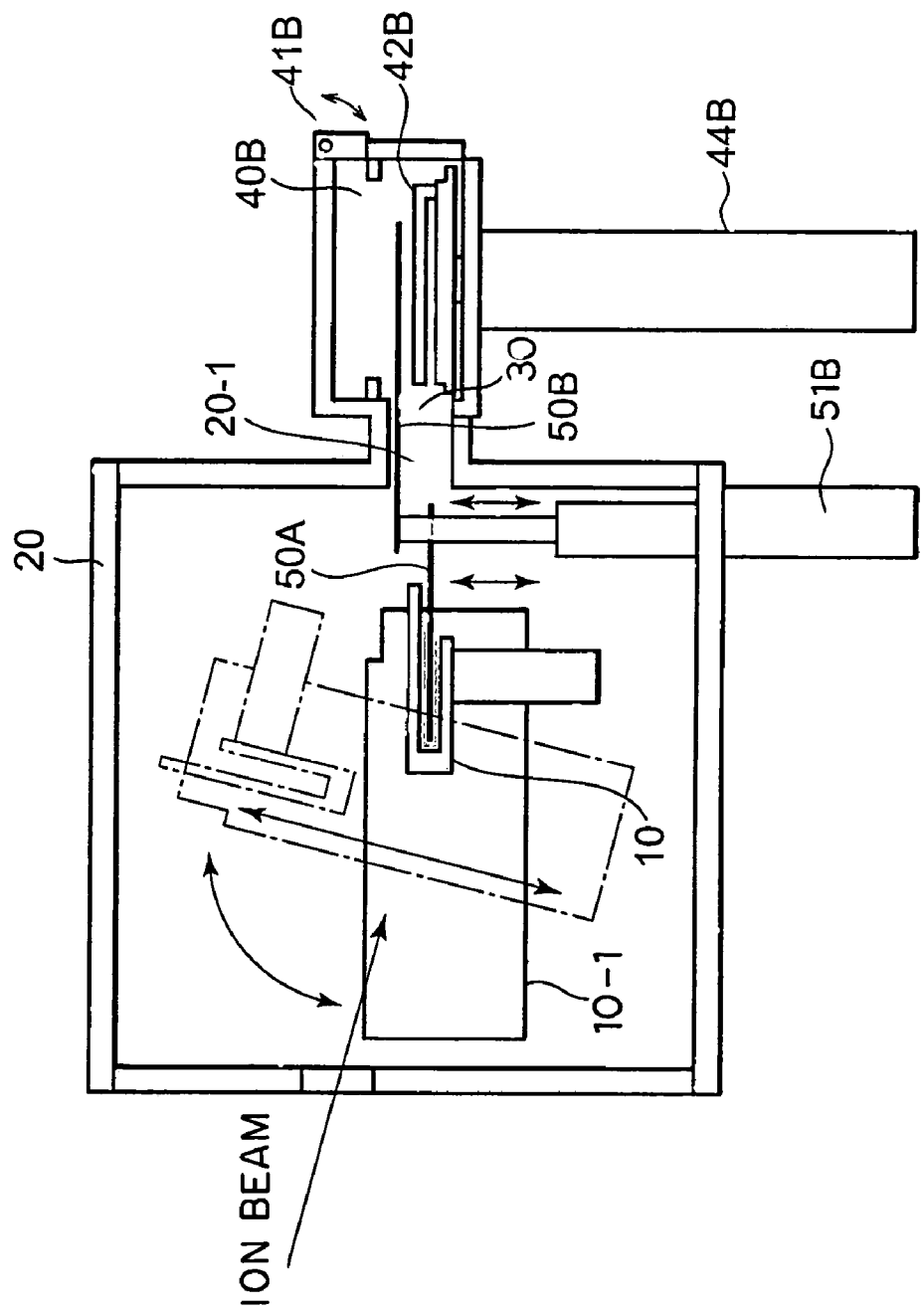
FIG. 6 is a sectional side view showing a schematic structure of the wafer processing system shown in FIG. 5.
Figure 7:
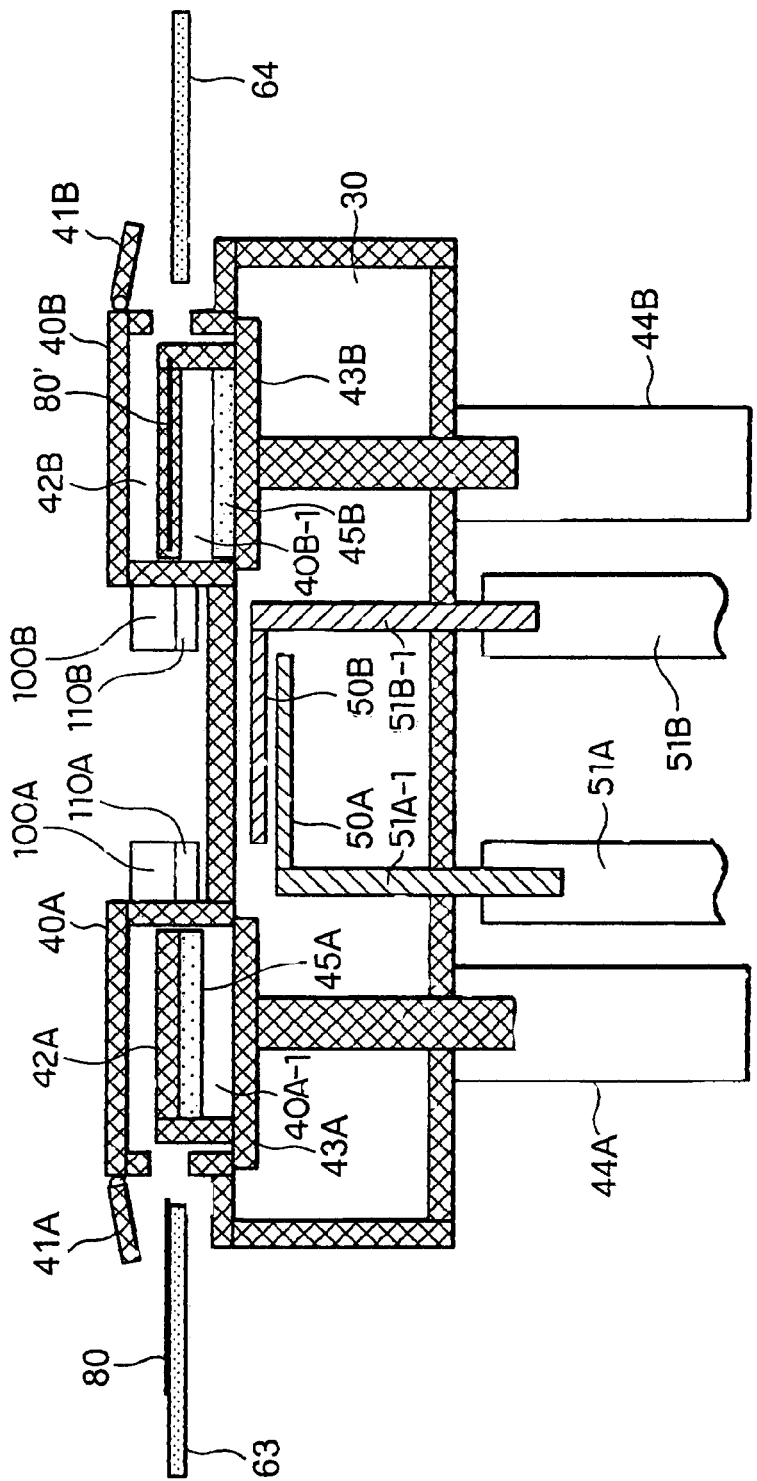
FIG. 7 is a vertical sectional view, as seen from the left side in FIG. 5, showing a structure of the main part of the wafer processing system.

Referring to FIGS. 5 to 7, description will be given of an embodiment of the wafer processing system according to this invention. FIGS. 5 and 6 are a partly sectional plan view and a sectional side view, respectively, each showing a schematic structure of the single-wafer type wafer processing system. FIG. 7 is a vertical sectional view, as seen from the left side in FIG. 5, showing a structure of the main part of the wafer processing system. In FIGS. 5 and 6, a vacuum process chamber 20 having therein a platen device 10 is formed with two load lock chambers 40A and 40B through a vacuum intermediate chamber 30. The platen device 10 has a platen for mounting and retaining thereon a semiconductor element manufacturing wafer. Physical processing such as ion implantation is applied to the wafer on the platen. The platen device 10 further comprises a rotation drive mechanism for rotating the platen, a scan drive mechanism for moving the rotating platen in at least one-axis directions in the rotation plane, a tilt drive mechanism for tilting the platen, and so on. These mechanisms are all well known and thus collectively identified by symbol 10-1. To give a brief explanation, the rotation drive mechanism can rotate, as a whole, the platen retaining the wafer, the scan drive mechanism, and the tilt drive mechanism in directions indicated by arrows in FIG. 6. The scan drive mechanism is provided with a ball screw unit and so on to thereby reciprocate the platen retaining the wafer in directions indicated by straight-line arrows in FIG. 6. The tilt drive mechanism tilts the platen to thereby tilt the wafer surface.

In FIG. 7, each of the load lock chambers 40A and 40B is provided with an open/close door 41A, 41B, a load lock pedestal 42A, 42B, and a lock plate 43A, 43B for opening and closing between the load lock chamber 40A, 40B and the vacuum intermediate chamber 30. Wafers 80 and 80' are transferred into and from the load lock chambers 40A and 40B through the open/close doors 41A and 41B, respectively, with respect to the exterior, i.e. the atmosphere side. The load lock pedestal 42A and the lock plate 43A are configured so as to be integrally movable upward and downward between the load lock chamber 40A and the vacuum intermediate chamber 30 by the use of a vertical drive mechanism 44A arranged outside the vacuum intermediate chamber 30. Likewise, the load lock pedestal 42B and the lock plate 43B are configured so as to be integrally movable upward and downward between the load lock chamber 40B and the vacuum intermediate chamber 30 by the use of a vertical drive mechanism 44B arranged outside the vacuum intermediate chamber 30. Naturally, a seal mechanism is provided between a drive shaft of each of the vertical drive mechanisms 44A and 44B and a wall of the vacuum intermediate chamber 30. In FIG. 7, the open/close doors 41A and 41B are shown at positions different from those shown in FIG. 5. This is for facilitating understanding of subsequent description. There arises no problem as long as the open/close doors 41A and 41B are provided at sides of the load lock chambers 40A and 40B, respectively.

The load lock pedestal 42A moves upward and downward between a height position where the load lock pedestal 42A has ascended into the load lock chamber 40A (hereinafter this height position will be referred to as an "upward position") and a height position where the load lock pedestal 42A has descended into the vacuum intermediate chamber 30 (hereinafter this height position will be referred to as a "downward position"). The load lock pedestal 42B is configured in the same manner.

The load lock chambers 40A and 40B are each opened to the atmosphere and evacuated when a wafer is transferred in and out. For this purpose, as shown in FIG. 7 only, the load lock chambers 40A and 40B are each provided with vacuum exhaustion and ventilation mechanisms 100A, 100B and slow rough vacuum exhaustion and slow atmosphere-opening ventilation mechanisms 110A and 110B for carrying out vacuum exhaustion and ventilation by somewhat taking time for preventing particles from flying up.

The load lock chambers 40A and 40B are communicable with the vacuum intermediate chamber 30 only through openings 40A-1 and 40B-1, respectively, which are shown in FIG. 7. These openings 40A-1 and 40B-1 are opened and closed by the lock plates 43A and 43B, respectively. Therefore, seal mechanisms (not illustrated) are provided at upper-surface peripheral edge portions of the lock plates 43A and 43B and at corresponding peripheral edge portions of the openings 40A-1 and 40B-1, respectively. The vacuum process chamber 20 and the vacuum intermediate chamber 30 communicate with each other through a passage opening 20-1 (FIG. 6). The passage opening 20-1 has a valid height that enables two wafer retaining arms mentioned below to pass therethrough.

Between the platen device 10 and the vacuum intermediate chamber 30, two wafer retaining arms 50A and 50B are installed corresponding to the load lock chambers 40A and 40B, respectively. The wafer retaining arms 50A and 50B are each provided with a wafer chuck mechanism at its tip. In this embodiment, the wafer chuck mechanism has a generally C-shape. However, the shape is arbitrary and the chuck manner may be any of known types such as a wafer mounting type, a wafer grasping type, or a wafer suction type. By the use of drive mechanisms 51A and 51B, the wafer retaining arms 50A and 50B are horizontally rotatable about their rotation shafts 51A-1, 51B-1, respectively, each extending vertically and are also vertically movable.

Particularly, in this embodiment, the rotation of the wafer retaining arm 50A is configured as a rotation that passes through a segment connecting between the rotation shaft of the wafer retaining arm 50A and the rotation shaft of the wafer retaining arm 50B and reciprocates between the platen device 10 and the load lock chamber 40A side. Likewise, the rotation of the wafer retaining arm 50B is configured as a rotation that passes through the segment connecting between the rotation shaft of the wafer retaining arm 50A and the rotation shaft of the wafer retaining arm 50B and reciprocates between the platen device 10 and the load lock chamber 40B side. Hereinafter, this rotation will be referred to as an "inward rotation" or an "inward rotational motion". Conversely, a rotation that does not pass through the segment connecting between the rotation shaft of the wafer retaining arm 50A and the rotation shaft of the wafer retaining arm 50B but reciprocates between the platen device 10 and the load lock chamber 40A side or between the platen device 10 and the load lock chamber 40B side will be referred to as an "outward rotation" or an "outward rotational motion".

Herein, a feature of this embodiment resides in that an upper limit position of the wafer retaining arm 50A is set lower than an upper limit position of the wafer retaining arm 50B and a lower limit position of the wafer retaining arm 50A is set lower than a lower limit position of the wafer retaining arm 50B. In addition, when the wafer retaining arms 50A and 50B are rotated, the wafer retaining arm 50A is always rotated at a height position lower than the wafer retaining arm 50B, thereby preventing collision therebetween during rotation of them. At any rate, the wafer retaining arms 50A and 50B each vertically moves between the upper limit position and the lower limit position with respect to height directions. Naturally, the relationship in height between the wafer retaining arms 50A and 50B may be reversed. The drive mechanisms 51A and 51B are individually provided for rotating and vertically moving the wafer retaining arms 50A and 50B individually. Since each drive mechanism can be realized by using the well-known technique, a structure thereof is not illustrated.

Figure 8B:
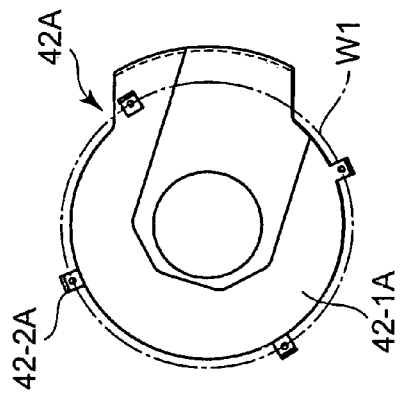
FIGS. 8A to 8D are diagrams showing one example of a wafer retaining arm, a load lock pedestal, and a lock plate used in the wafer processing system of this invention.
Figure 8D:
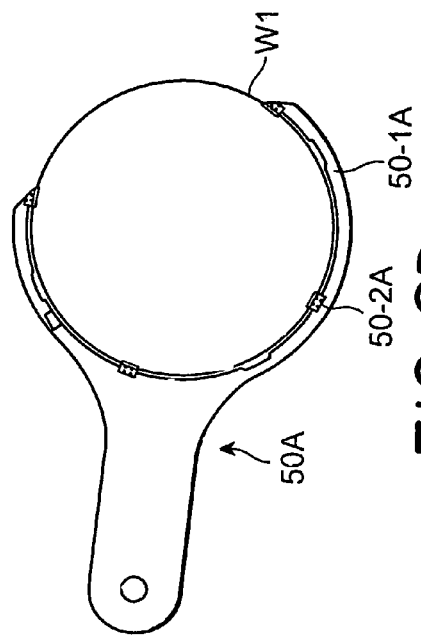
Figure 8A:
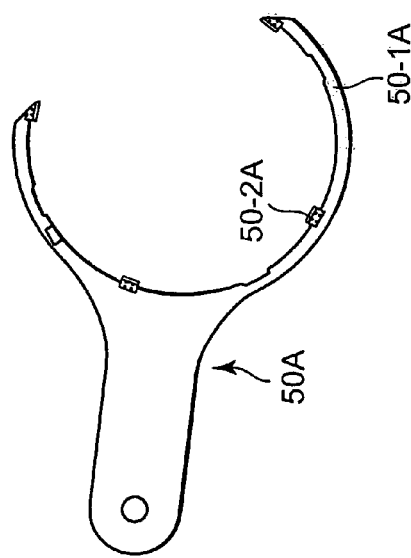

FIGS. 8A to 8D show one example of the wafer retaining arm 50A, the load lock pedestal 42A, and the lock plate 43A. As shown in FIG. 8A, the wafer retaining arm 50A has the generally C-shaped wafer chuck mechanism at its tip. The wafer chuck mechanism comprises a generally C-shaped frame 50-1A and a plurality of (four in this embodiment) chuck portions 50-2A provided on the frame 50-1A so as to be directed toward its inner peripheral side.

As shown in FIG. 8B, the load lock pedestal 42A comprises a base plate 42-1A and a plurality of (four in this embodiment) chuck portions 42-2A provided on the base plate 42-1A at its outer peripheral edge portions. The chuck portions 42-2A are provided at positions corresponding to the outer periphery of a wafer W1 identified by a long and short dash line, wherein those positions do not overlap the chuck portions 50-2A of the wafer retaining arm 50A.

Figure 8C:
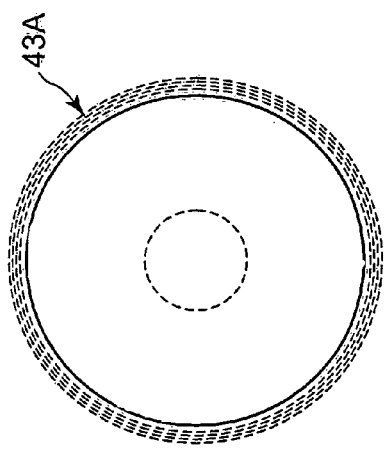

FIG. 8C shows the lock plate 43A. The lock plate 43A has a circular shape in this embodiment so as to conform to the shape of the opening 40A-1 (FIG. 7).

FIG. 8D shows the state where the wafer chuck mechanism of the wafer retaining arm 50A retains the wafer W1. The wafer W1 is retained by the four chuck portions 50-2A. In this embodiment, the frame 50-1A of the wafer retaining arm 50A is formed slightly larger than the external form of the base plate 42-1A of the load lock pedestal 42A. With this configuration, when the load lock pedestal 42A located at its downward position is retaining the wafer W1, the frame 50-1A located at its lower limit position right under the base plate 42-1A (but above the lock plate 43A) moves upward to take hold of the wafer W1 by the chuck portions 50-2A. On the other hand, when the load lock pedestal 42B is located at its downward position, the wafer chuck mechanism of the wafer retaining arm 50B located at its upper limit position and retaining a wafer moves downward to its lower limit position from right above the load lock pedestal 42B so that the wafer is handed over to the load lock pedestal 42B. That is, in this embodiment, the wafer chuck mechanism moves upward with respect to the load lock pedestal to thereby receive the wafer from the load lock pedestal. On the other hand, the wafer chuck mechanism moves downward with respect to the load lock pedestal to thereby hand over the wafer to the load lock pedestal. Naturally, this is only one example. The platen device 10 is also provided with a wafer chuck mechanism such as an electrostatic clamp. With this configuration, delivery of a wafer between the wafer chuck mechanism of each of the wafer retaining arms 50A and 50B and the wafer chuck mechanism of the platen device 10 is realized like in the foregoing manner.

Referring back to FIG. 5, also in this embodiment, there is provided a loading portion 60 for implementing wafer transfer in and out with respect to the load lock chambers 40A and 40B. The loading portion 60 comprises an aligner 61, first and second robots 63 and 64 for wafer transfer, and cassette stations 71 and 72 installed corresponding to the respective robots, which are all installed on a platform (not illustrated) arranged in the atmosphere. The aligner 61 is located substantially at the center of the platform and between the first and second robots 63 and 64.

Figure 1:
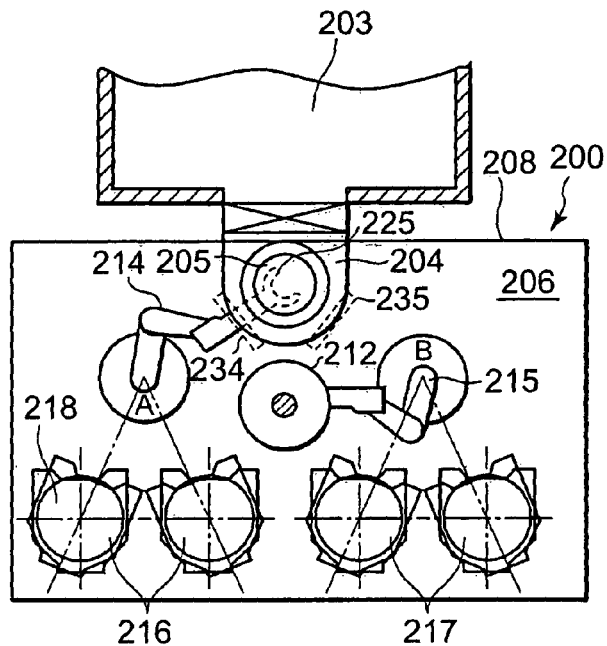
FIG. 1 is a diagram showing a schematic structure of a wafer transfer device in a conventional wafer processing system.

The aligner 61 is a device for positioning a wafer in an angular direction suitable for ion implantation, which is the same as that described with reference to FIG. 1. To give a brief explanation, the aligner 61 comprises a trifurcate wafer stay 61-1 for placing thereon a wafer and a retaining portion 61-2 provided at a center portion of the wafer stay 61-1 and capable of vertical movement and rotation while retaining the wafer. When a wafer is placed on the wafer stay 61-1, the retaining portion 61-2 moves upward and rotates at a predetermined angle to perform positioning of the wafer and, when finished, moves downward to place the wafer again on the wafer stay 61-1. The first and second robots 63 and 64 each also have the same structure and function as those of the robot described with reference to FIG. 1. That is, the first robot 63 is a plural-axis arm robot and is installed at a predetermined position on the platform. The first robot 63 has an arm structure for retaining a wafer and implementing wafer transfer in and out with respect to the load lock chamber 40A and the cassette stations 71 and is capable of upward/downward movement, rotation, and forward/backward movement. The second robot 64 has the same structure.

On the platform, the two cassette stations 71 are arranged at a position on the side opposite to the load lock chamber 40A and the two cassette stations 72 are arranged at a position on the side opposite to the load lock chamber 40B. The cassette stations 71 and 72 correspond to the first and second robots 63 and 64, respectively. Naturally, it is possible to provide a required number of cassette stations for each robot and, therefore, as long as there is room remaining in the loading portion 60, the number of cassette stations may be more than four.

FIG. 7 shows that the wafer retaining arms 50A and 50B cross each other at different levels at their upper limit positions so as to be in a standby state. In FIG. 5, the standby state occurs close to the vacuum intermediate chamber 30 as shown by broken lines. However, the standby state preferably occurs in the vacuum intermediate chamber 30. In FIG. 7, an unprocessed wafer 80 is being transferred into the load lock chamber 40A by the first robot 63 while a processed wafer 80' retained by the load lock pedestal 42B is being taken out from the load lock chamber 40B by the second robot 64. Further, as shown in FIG. 7, when a space is formed between the load lock pedestal 42A and the lock plate 43A, it is preferable to install a spacer 45A in this space. This is because when there is the space between the load lock pedestal 42A and the lock plate 43A, the amount of air to be exhausted from the load lock chamber 40A increases so that a vacuum exhaustion time is prolonged correspondingly. A spacer 45B is likewise provided between the load lock pedestal 42B and the lock plate 43B. However, since the wafer retaining arm 50A passes, while rotating, between the load lock pedestal 42A located at its downward position and the lock plate 43A, the spacer 45A is provided on a lower surface of the load lock pedestal 42A. On the other hand, since the wafer retaining arm 50B passes, while rotating, between the load lock pedestal 42B located at its downward position and the lock plate 43B, the spacer 45B is provided on an upper surface of the lock plate 43B. This is because there is the difference in level between the lower limit positions of the wafer retaining arms 50A and 50B as described above.

Description will be given hereinbelow of the flow with respect to only one wafer in the case where the unprocessed wafer 80 is transferred in by the first robot 63 while the processed wafer 80' is transferred out by the second robot 64.

First Step: The first robot 63 takes out an unprocessed wafer from the cassette station 71 (or 72) and places it on the aligner 61.

Second Step: The aligner 61 performs positioning of the wafer by notch matching.

Third Step: The first robot 63 takes hold of the wafer adjusted in position on the aligner 61 and introduces it into the load lock chamber 40A. In this event, the open/close door 41A of the load lock chamber 40A is opened. In the load lock chamber 40A, the load lock pedestal 42A is located at its upward position so that the lock plate 43A closes the opening 40A-1.

Fourth Step: The open/close door 41A is closed and the inside of the load lock chamber 40A is evacuated.

Fifth Step: Upon completion of the vacuum exhaustion of the load lock chamber 40A, the load lock pedestal 42A moves downward to its downward position to establish communication between the load lock chamber 40A and the vacuum intermediate chamber 30. At this time, the wafer retaining arm 50A is in a standby state at its lower limit position.

Sixth Step: The wafer retaining arm 50A rotates toward the load lock pedestal 42A so that the wafer chuck mechanism moves to a position right under the load lock pedestal 42A. Then, the wafer retaining arm 50A moves upward to its upper limit position so that the wafer chuck mechanism takes hold of the wafer. Subsequently, the wafer retaining arm 50A rotates in the opposite direction to reach a position above the wafer chuck mechanism of the platen device 10 and then moves downward to its lower limit position to deliver the wafer to the platen device 10.

Seventh Step: Ion implantation is applied to the wafer on the platen device 10. At this time, the wafer retaining arm 50B is in a standby state at its lower limit position and the load lock pedestal 42B is located at its downward position.

Eighth Step: Upon completion of the ion implantation, the wafer retaining arm 50B rotates toward the platen device 10 to reach a position under the wafer chuck mechanism of the platen device 10 and then moves upward to its upper limit position to take hold of the processed wafer. Subsequently, the wafer retaining arm 50B rotates in the opposite direction to reach a position right above the load lock pedestal 42B and then moves downward to its lower limit position so that the wafer is delivered to the load lock pedestal 42B.

Ninth Step: The wafer retaining arm 50B rotates to return to the standby state and the load lock pedestal 42B moves upward into the load lock chamber 40B so that the lock plate 43B closes the opening 40B-1.

Tenth Step: After opening the load lock chamber 40B to the atmosphere, the open/close door 41B is opened.

Eleventh Step: The second robot 64 takes hold of the processed wafer placed on the load lock pedestal 42B in the load lock chamber 40B and places it in the cassette station 72.

The foregoing first to eleventh steps represent the flow of the single wafer. Actually, when the processing starts, the respective components operate in parallel. Accordingly, transfer processing is carried out wherein three wafers (including unprocessed and processed wafers) are always present in the path formed by aligner 61—load lock chamber 40A—platen device 10—load lock chamber 40B—aligner 61. This transfer processing will hereinafter be referred to as "three-wafer transfer". Alternatively, transfer processing may be carried out wherein four wafers (including unprocessed and processed wafers) are always present in the foregoing path, which will hereinafter be referred to as "four-wafer transfer". At any rate, the wafer transfer processing is implemented under the control of a controller (not illustrated).

Referring also to FIGS. 9A to 9G and FIGS. 10 to 13, the operation of the wafer processing system according to this embodiment will be described in the case of the three-wafer transfer. FIGS. 9A to 9G are diagrams for explaining operation states of the respective components of the wafer processing system.

Figure 9A:
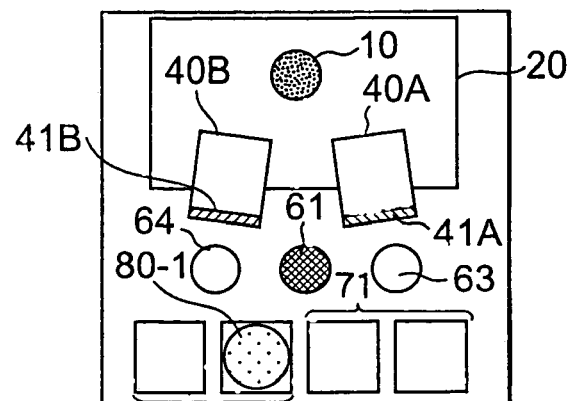
Figure 10:
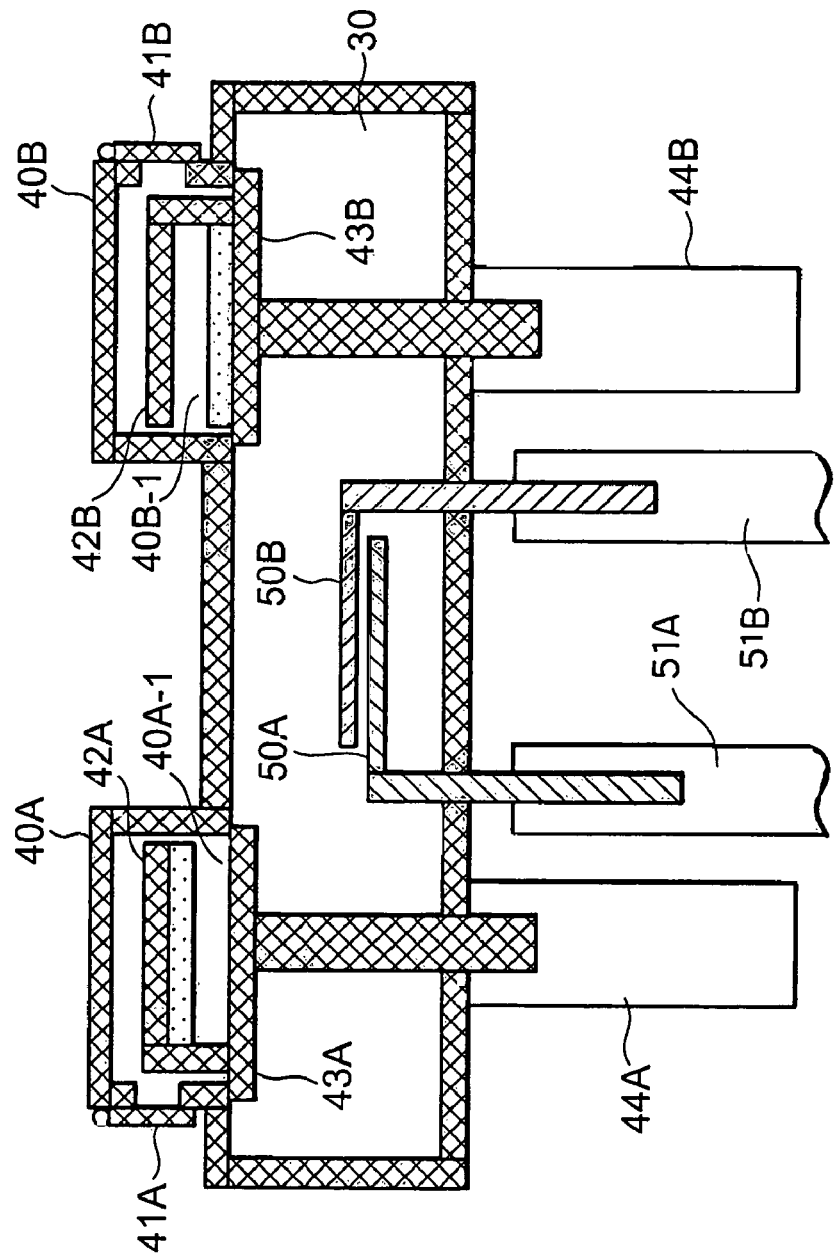
FIG. 10 is a vertical sectional view for explaining the states of two load lock chambers and two wafer retaining arms in the wafer processing system of this invention at a certain time instant.

FIG. 9A shows the state before the start of the wafer transfer processing, wherein the first robot 63 starts to go to the cassette station 72 in order to pick up an unprocessed wafer 80-1. FIG. 10 shows the states of the load lock chambers 40A and 40B and the wafer retaining arms 50A and 50B in this event. The open/close doors 41A and 41B of the load lock chambers 40A and 40B are closed and the load lock pedestals 42A and 42B are located at their upward positions in the load lock chambers 40A and 40B, respectively. On the other hand, the wafer retaining arms 50A and 50B are in a standby state at their lower limit positions, respectively.

Figure 9B:
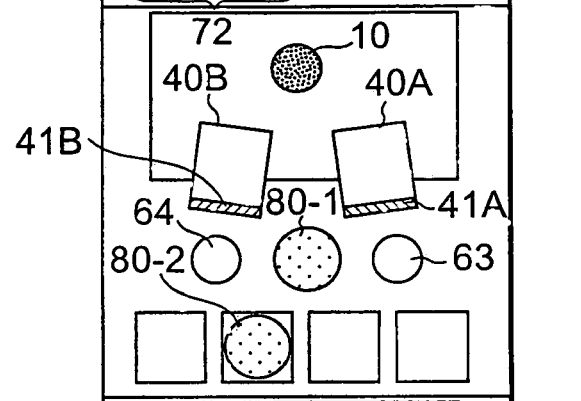

In FIG. 9B, the wafer 80-1 is placed on the aligner 61 by the first robot 63 where positioning of the wafer 80-1 is carried out.

Figure 9C:
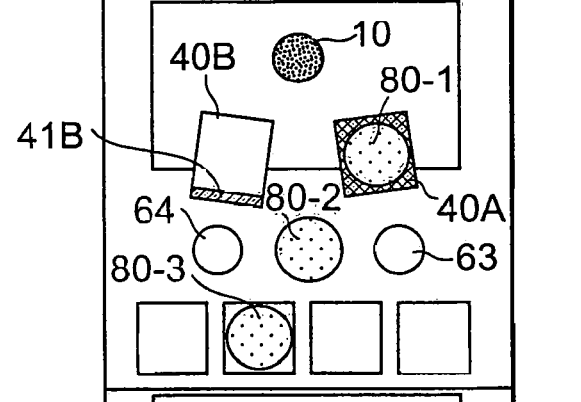

In FIG. 9C, the open/close door 41A of the load lock chamber 40A is opened and the first robot 63 takes hold of the wafer 80-1 on the aligner 61 and places it on the load lock pedestal 42A in the load lock chamber 40A. Then, the open/close door 41A is closed and the inside of the load lock chamber 40A is evacuated. Upon completion of the vacuum exhaustion, the load lock pedestal 42A moves downward to its downward position. Then, the wafer retaining arm 50A rotates so that the wafer chuck mechanism moves to a position right under the load lock pedestal 42A, and then moves upward to its upper limit position so that the wafer chuck mechanism takes hold of the wafer 80-1 on the load lock pedestal 42A. The wafer retaining arm 50A rotates at its upper limit position toward the platen device 10 and then moves downward to its lower limit position so that the wafer 80-1 is delivered from the wafer chuck mechanism of the wafer retaining arm 50A to the wafer chuck mechanism of the platen device 10. During this, the first robot 63 returns to the cassette station 72, takes hold of a next unprocessed wafer 80-2, and places it on the aligner 61.

Figure 9D:
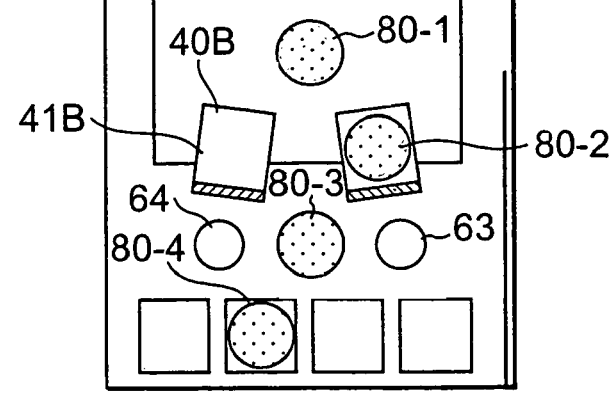

In FIG. 9D, ion implantation is started for the wafer 80-1 on the platen device 10. During this, the load lock pedestal 42A moves upward into the load lock chamber 40A and the open/close door 41A is opened after opening the load lock chamber 40A to the atmosphere. On the other hand, the first robot 63 takes hold of the wafer 80-2 on the aligner 61 and places it on the load lock pedestal 42A. Then, the open/close door 41A is closed and vacuum exhaustion of the load lock chamber 40A is carried out. Upon completion of the vacuum exhaustion, the load lock pedestal 42A moves downward to its downward position. During the vacuum exhaustion, the first robot 63 takes hold of a next unprocessed wafer 80-3 from the cassette station 72 and places it on the aligner 61.

In FIG. 9E, upon completion of the ion implantation for the wafer 80-1, the wafer retaining arm 50B located at its lower limit position rotates toward the platen device 10 so that the wafer chuck mechanism reaches a position right under the wafer chuck mechanism of the platen device 10, and then moves upward to its upper limit position so that the wafer chuck mechanism of the wafer retaining arm 50B takes hold of the processed wafer 80-1. Subsequently, the wafer retaining arm 50B rotates toward the load lock pedestal 42B located at its downward position so that the wafer chuck mechanism moves to a position right above the load lock pedestal 42B. Then, the wafer retaining arm 50B moves downward to its lower limit position so that the processed wafer 80-1 is delivered to the load lock pedestal 42B from the wafer chuck mechanism of the wafer retaining arm 50B. While the wafer retaining arm 50B delivers the processed wafer 80-1 from the platen device 10 to the load lock pedestal 42B, the wafer retaining arm 50A receives the unprocessed wafer 80-2 from the load lock pedestal 42A and then rotates toward the platen device 10 to thereby deliver the unprocessed wafer 80-2 to the platen device 10.

Figure 11:
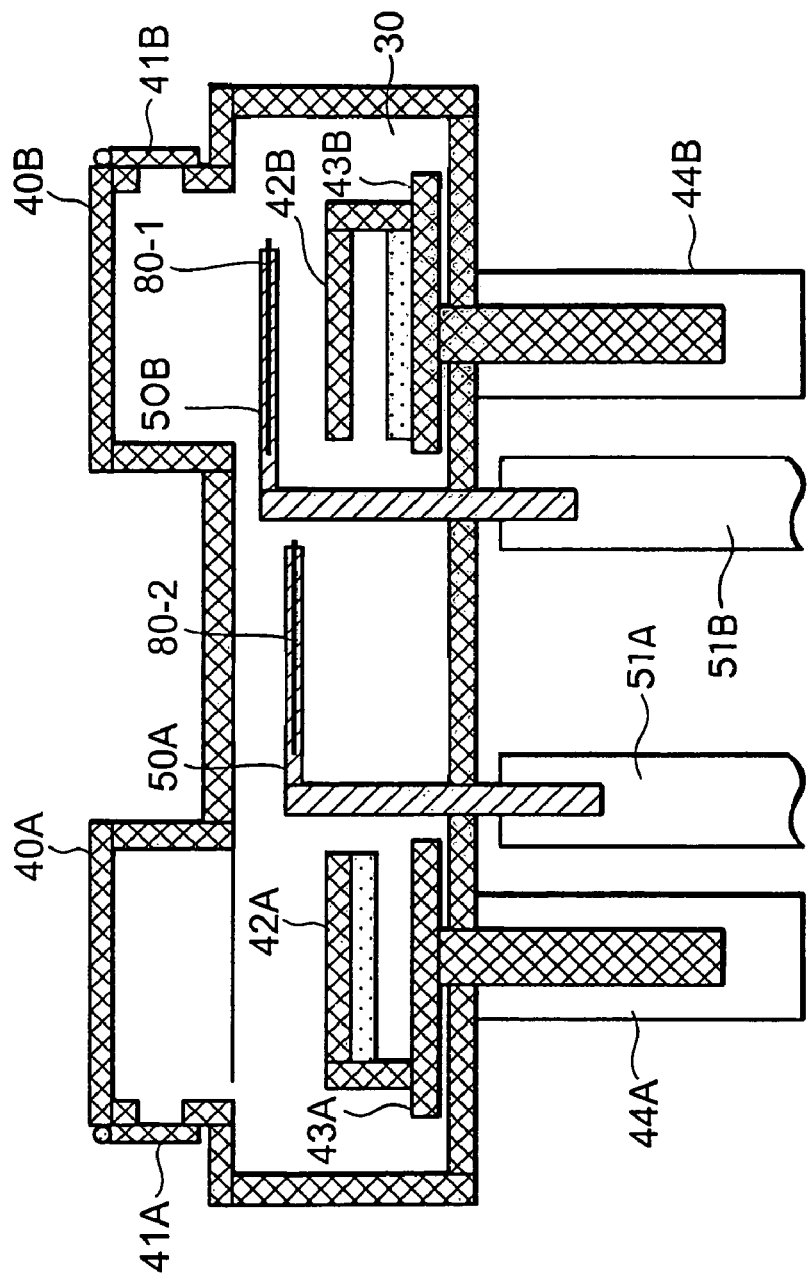
FIG. 11 is a vertical sectional view for explaining the states of the two load lock chambers and the two wafer retaining arms in the wafer processing system of this invention at a time instant different from FIG. 10.

FIG. 11 shows the states of the load lock chambers 40A and 40B and the wafer retaining arms 50A and 50B in this event. The open/close doors 41A and 41B of the load lock chambers 40A and 40B are closed. The wafer 80-2 on the load lock pedestal 42A is grasped by the wafer chuck mechanism of the wafer retaining arm 50A and transferred to the platen device 10. On the other hand, the processed wafer 80-1 taken out from the platen device 10 is transferred to the position right above the load lock pedestal 42B by the wafer retaining arm 50B. Then, the wafer retaining arm 50B moves downward to its lower limit position so that the processed wafer 80-1 is delivered to the load lock pedestal 42B. Thereafter, the load lock pedestals 42A and 42B move upward into the load lock chambers 40A and 40B, respectively.

In FIG. 9F, while ion implantation is carried out for the wafer 80-2 delivered to the platen device 10, the open/close door 41A is opened so that the first robot 63 delivers the unprocessed wafer 80-3 to the load lock pedestal 42A in the load lock chamber 40A. On the other hand, the open/close door 41B is opened so that the second robot 64 takes out the processed wafer 80-1 from the load lock pedestal 42B in the load lock chamber 40B and places it in the cassette station 72.

Figure 12:
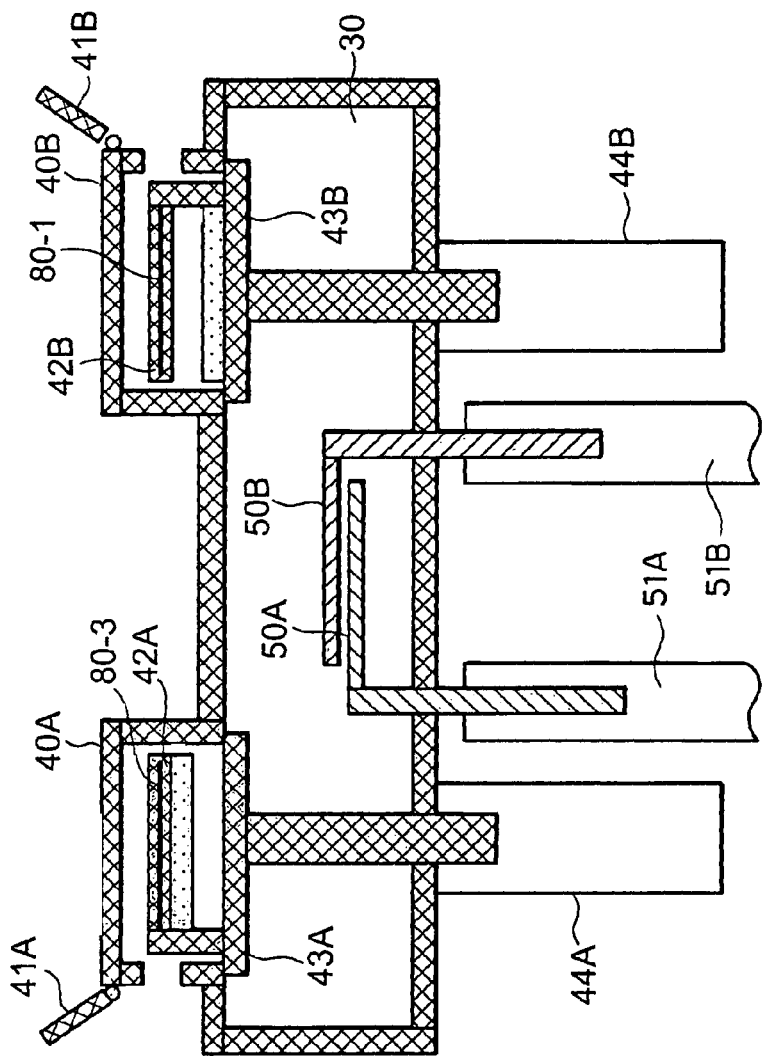
FIG. 12 is a vertical sectional view for explaining the states of the two load lock chambers and the two wafer retaining arms in the wafer processing system of this invention at a time instant different from FIGS. 10 and 11.

FIG. 12 shows the states of the load lock chambers 40A and 40B and the wafer retaining arms 50A and 50B in this event. The open/close doors 41A and 41B of the load lock chambers 40A and 40B are opened. The unprocessed wafer 80-3 is delivered to the load lock pedestal 42A while the processed wafer 80-1 is being taken out from the load lock pedestal 42B. The wafer retaining arms 50A and 50B are in a standby state at their lower limit positions, respectively.

In FIG. 9F, the open/close doors 41A and 41B of the load lock chambers 40A and 40B are closed and the load lock pedestals 42A and 42B move downward to their downward positions, respectively. Then, upon completion of the ion implantation for the wafer 80-2, the wafer retaining arm 50B takes hold of the wafer 80-2 on the platen device 10 and transfers it to the position right above the load lock pedestal 42B. In parallel, the wafer 80-3 on the load lock pedestal 42A is transferred to the platen device 10 by the wafer retaining arm 50A. During this, the first robot 63 places a next unprocessed wafer 804 on the aligner 61 from the cassette station 72.

Figure 13:
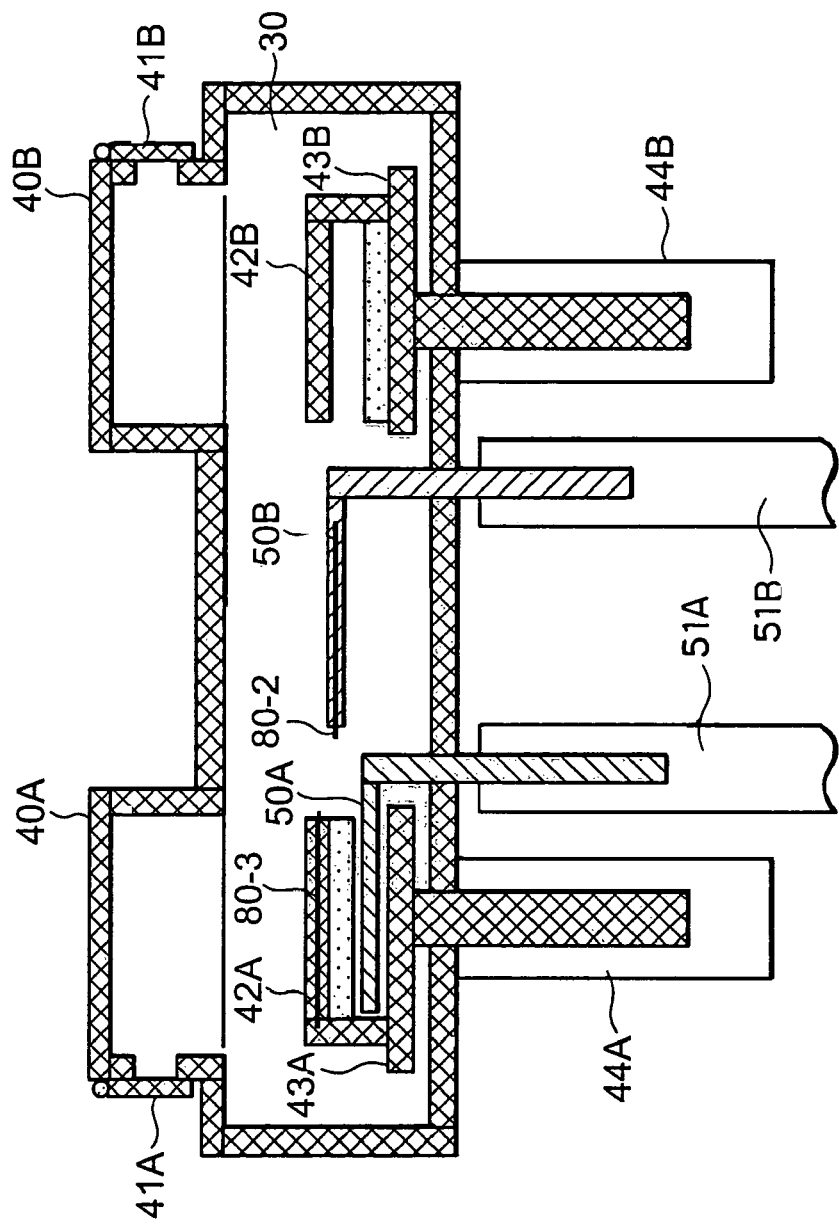
FIG. 13 is a vertical sectional view for explaining the states of the two load lock chambers and the two wafer retaining arms in the wafer processing system of this invention at a time instant different from FIGS. 10, 11, and 12.

FIG. 13 shows the states of the load lock chambers 40A and 40B and the wafer retaining arms 50A and 50B in this event. The open/close doors 41A and 41B of the load lock chambers 40A and 40B are closed. The wafer retaining arm 50A rotates at its lower limit position toward the load lock chamber 40A so that the wafer chuck mechanism is located at the position right under the load lock pedestal 42A. On the other hand, the wafer retaining arm 50B rotates at its lower limit position toward the platen device 10 so that the wafer chuck mechanism is located at the position right under the wafer chuck mechanism of the platen device 10. Thereafter, the wafer retaining arm 50B moves upward to its upper limit position and then rotates toward the load lock pedestal 42B side to thereby deliver the processed wafer 80-2 to the load lock pedestal 42B. In parallel, the wafer retaining arm 50A moves upward to its upper limit position to receive the wafer 80-3 and then rotates toward the platen device 10. As a result, the state shown in FIG. 11 is achieved, wherein, however, the wafer 80-2 is replaced with the wafer 80-3 and the wafer 80-1 is replaced with the wafer 80-2.

Thereafter, FIGS. 9E to 9G are repeated. As clear from FIGS. 9E to 9G, three wafers are always present in the path starting from the cassette station 72 and returning to the cassette station 72. According to the three-wafer transfer processing operation as described above, the throughput, i.e. the wafer processing capability, is largely improved as compared with the two-wafer transfer processing operation described with reference to FIG. 2 wherein the single load lock chamber and the single I-shaped wafer retaining arm are employed. This is because, since an atmosphere-opening/vacuum exhaustion time, particularly the vacuum exhaustion time, for the load lock chamber is long as compared with an ion implantation time, if two load lock chambers are employed, a standby time in each load lock chamber becomes half as compared with the case of FIG. 2.

Figure 14A:
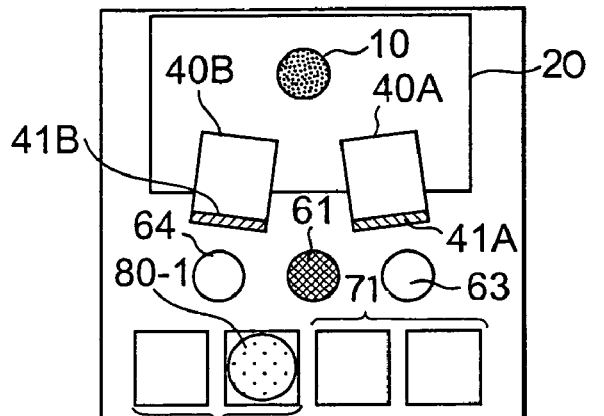
Figure 14B:
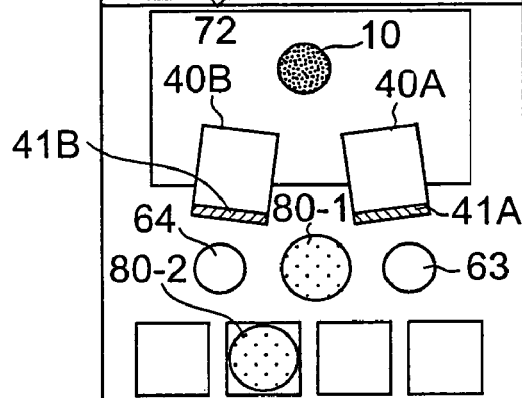
Figure 14C:
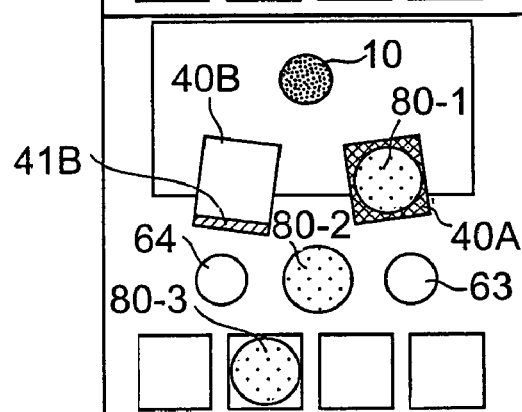

FIGS. 14A to 14G are diagrams showing a wafer transfer processing operation in the case of the four-wafer transfer. Since FIGS. 14A to 14D are identical with FIGS. 9A to 9D, explanation thereof is omitted. That is, FIGS. 14A to 14D relate to the operation immediately after the start of ion implantation and therefore become identical with the case of the three-wafer transfer. However, as shown in FIGS. 14E to 14G, after ion implantation is started for a first wafer 80-1, four wafers are always present in the path starting from the cassette station 72 and returning to the cassette station 72. This is because of the following reason.

In the case of the three-wafer transfer, the operation of taking out the unprocessed wafers from the cassette station 72 is carried out only by the first robot 63. On the other hand, in the case of the four-wafer transfer, the operation of taking out unprocessed wafers from the cassette station 72 is carried out by both the first and second robots 63 and 64. Then, the wafer is always placed on the aligner 61 by either of the first and second robots 63 and 64.

The foregoing four-wafer transfer processing operation is realized by the first and second robots 63 and 64. Therefore, the wafer transfer manner from the load lock chamber 40A, through the platen device 10, to the load lock chamber 40B is the same as that in the case of the three-wafer transfer. Accordingly, hereinbelow, description will be only given of a wafer transfer manner achieved by the first and second robots 63 and 64.

Figure 14D:
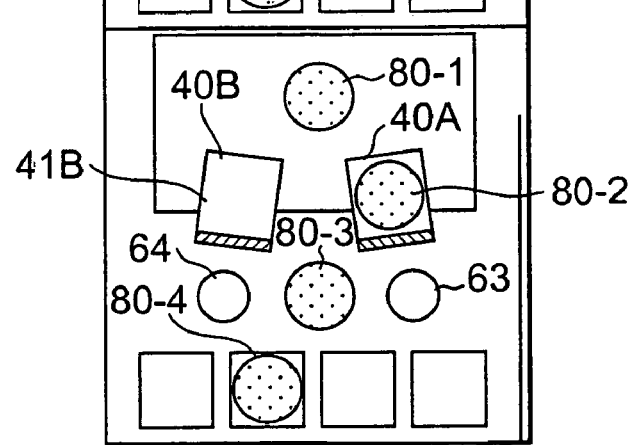

As described with reference to FIG. 9D, the first robot 63 takes out an unprocessed wafer 80-3 from the cassette station 72 and places it on the aligner 61 in FIG. 14D.

In FIG. 14E, upon completion of positioning of the wafer 80-3 by the aligner 61, the first robot 63 takes hold of the wafer 80-3 for transferring it into the load lock chamber 40A. In parallel, the second robot 64 takes out a next unprocessed wafer 80-4 from the cassette station 72 and places it on the aligner 61.

In FIG. 14F, the first robot 63 places the wafer 80-3 on the load lock pedestal 42A in the load lock chamber 40A. In parallel, the second robot 64 takes out the processed wafer 80-1 from the load lock chamber 40B and stores it in the cassette station 72. During this, the aligner 61 carries out positioning of the wafer 80-4.

In FIG. 14G, the first robot 63 takes hold of the wafer 80-4 on the aligner 61. In parallel, the second robot 64 takes out a next unprocessed wafer 80-5 from the cassette station 72 and places it on the aligner 61.

Thereafter, FIGS. 14E to 14G are repeated.

As described above, in the four-wafer transfer processing operation shown in FIGS. 14A to 14G, the load lock chamber 40A, being one of the load lock chambers, serves for transfer-in or transfer-out of an unprocessed wafer by the first robot 63 corresponding thereto, while the other load lock chamber 40B serves for transfer-out or transfer-in of a processed wafer by the second robot 64 corresponding thereto. Then, transfer of an unprocessed wafer to the aligner 61 is alternately carried out by the first and second robots 63 and 64. With this configuration, while the first robot 63 transfers an unprocessed wafer to the load lock chamber 40A, the second robot 64 transfers a next unprocessed wafer to the aligner 61 and, further, while the second robot 64 transfers a processed wafer from the load lock chamber 40B, the first robot 63 transfers a next unprocessed wafer to the aligner 61. As a result, while ion implantation is performed for a wafer on the platen device 10, four unprocessed and processed wafers in total are present in the path of aligner 61—load lock chamber 40A—platen device 10—load lock chamber 40B—aligner 61. This represents that, as compared with the three-wafer transfer processing operation, the loss time can be further reduced and the throughput can be further improved according to the four-wafer transfer processing operation.

Figure 15:
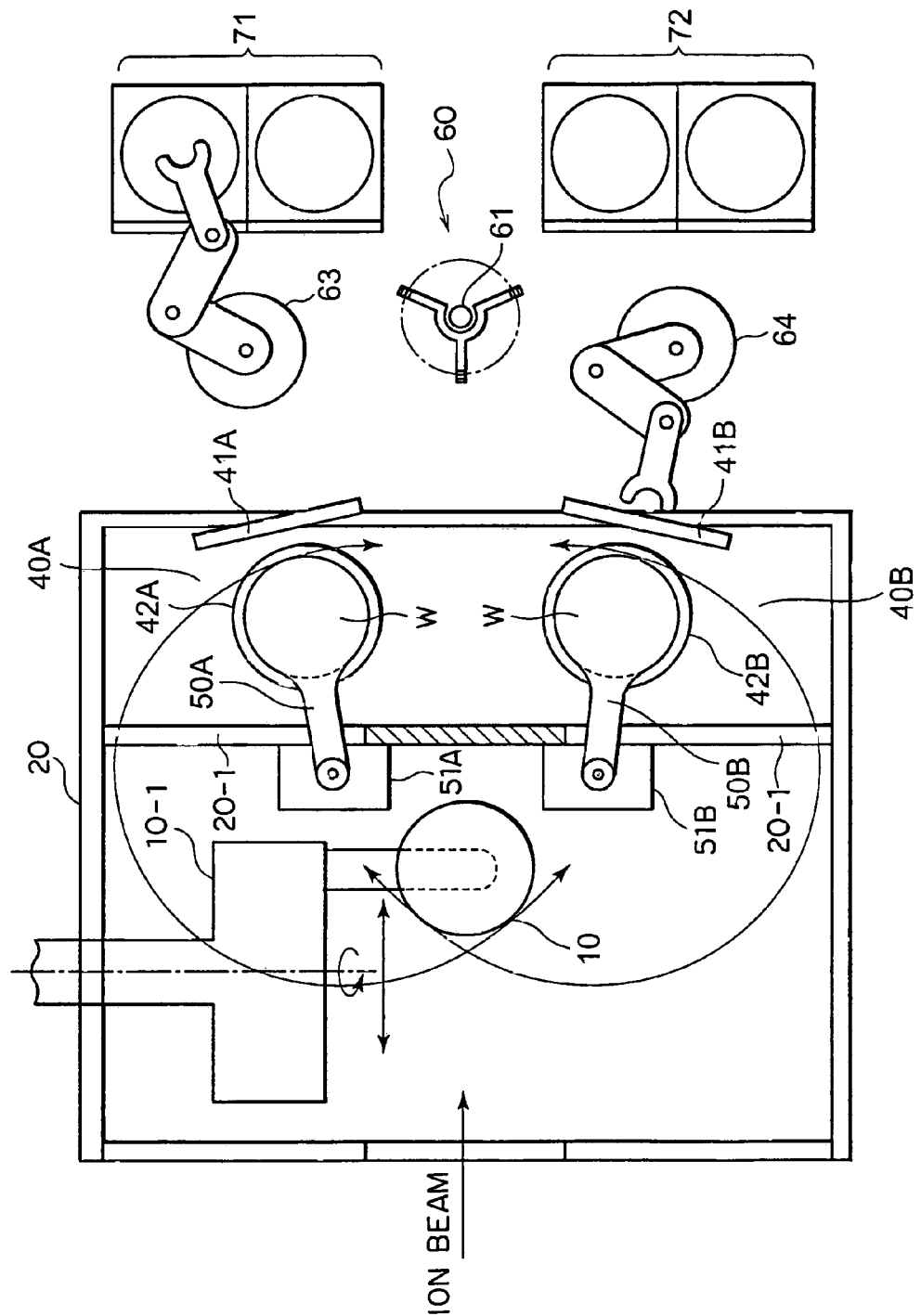
FIG. 15 is a partly sectional plan view showing a schematic structure of an embodiment wherein the wafer retaining arms of the wafer processing system shown in FIG. 5 each make an outward rotation.

Although this invention has been described in terms of the preferred embodiment, this invention is not limited thereto. For example, FIG. 5 shows the example where the wafer retaining arms 50A and 50B make the inward rotations, but those arms may make the outward rotations. This is shown in FIG. 15. This example is the same as that in FIG. 5 except that the wafer retaining arms 50A and 50B each reciprocatingly rotate toward the inner wall of the vacuum process chamber 20. As clear from FIG. 15, the vacuum process chamber 20 needs to be slightly increased in size in order to ensure a space for the outward rotations of the wafer retaining arms 50A and 50B. On the other hand, it may also be configured such that the wafer retaining arms 50A and 50B make inward rotations that do not cross each other. Also in this case, the vacuum process chamber 20 needs to be slightly increased in size in order to ensure a greater interval between the rotation shafts of the wafer retaining arms 50A and 50B.

Figure 16:
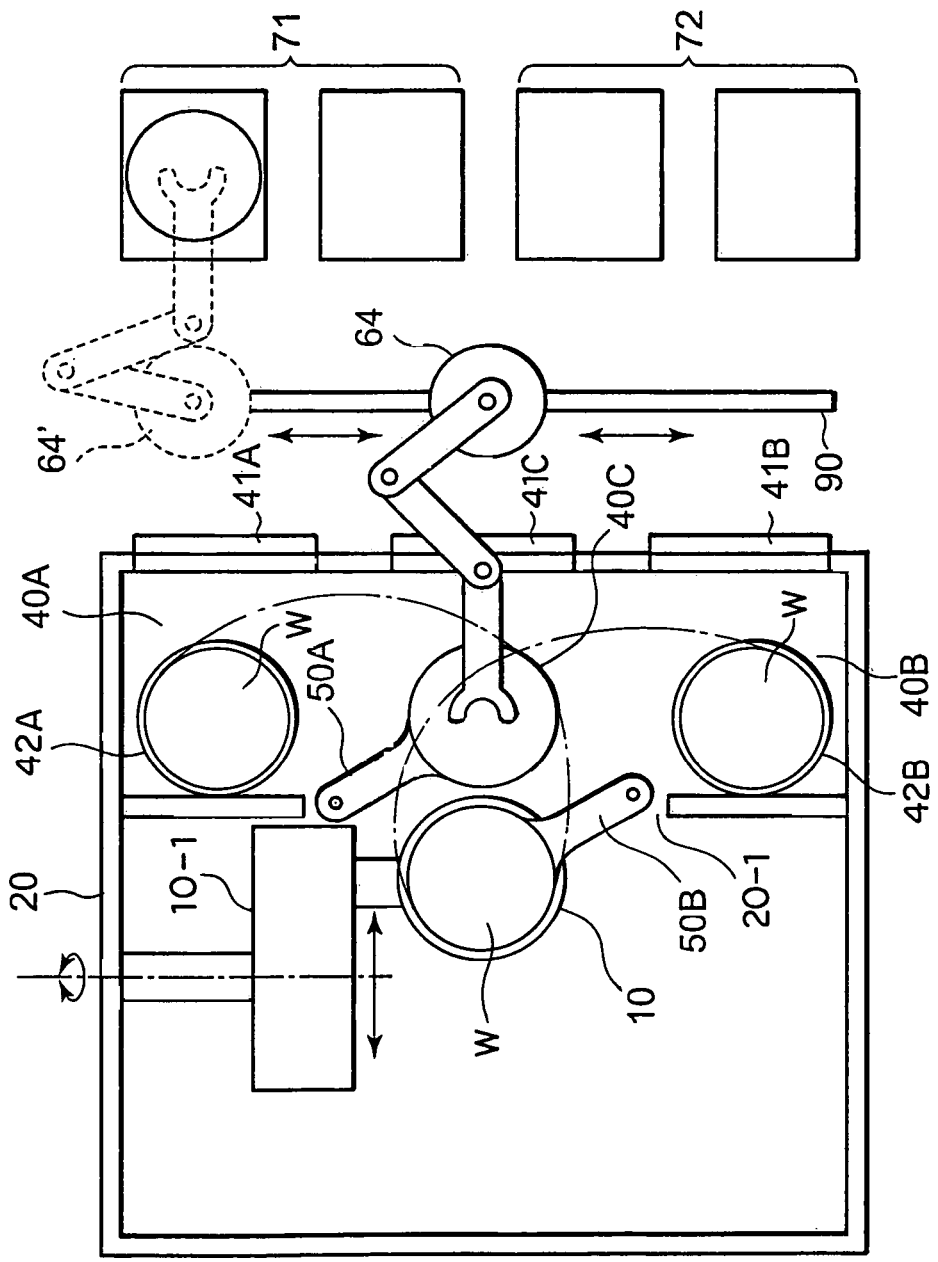
FIG. 16 is a diagram showing a schematic structure of another embodiment of a wafer processing system according to this invention.

FIG. 16 shows a schematic structure of another embodiment of a wafer processing system according to this invention. In this embodiment, three load lock chambers are provided. Specifically, two load lock chambers 40A and 40B like those shown in FIG. 5 are exclusively used for transfer-in of unprocessed wafers, while, a third load lock chamber 40C exclusively used for transfer-out of a processed wafer is provided between the load lock chambers 40A and 40B. Although not illustrated, the third load lock chamber 40C is provided, like the load lock chambers 40A and 40B, with an open/close door 41C for taking out a processed wafer and a vertically movable load lock pedestal having a lock plate serving for opening and closing between the third load lock chamber 40C and the vacuum intermediate chamber 30 located below. The other structure may be the same as that of FIG. 5 except a later-described structure outside the vacuum process chamber 20.

In this wafer processing system, while the wafer retaining arm 50A transfers an unprocessed wafer to the platen device 10 from the load lock pedestal 42A of the load lock chamber 40A, the wafer retaining arm 50B transfers a processed wafer from the platen device 10 to the load lock pedestal of the load lock chamber 40C. On the other hand, while the wafer retaining arm 50B transfers an unprocessed wafer to the platen device 10 from the load lock pedestal 42B of the load lock chamber 40B, the wafer retaining arm 50A transfers a processed wafer from the platen device 10 to the load lock pedestal of the load lock chamber 40C.

The wafer processing system further comprises, outside the vacuum process chamber 20, at least one robot 64' for wafer transfer and a plurality of pairs of wafer cassettes 71 and 72 for accommodating unprocessed wafers and processed wafers. Particularly, the robot 64' comprises a wafer positioning aligner (not illustrated) and is movable on a rail 90 along the three load lock chambers 40A, 40B, and 40C. With this configuration, transfer-in of unprocessed wafers and transfer-out of a processed wafer with respect to the transfer-in dedicated load lock chambers 40A and 40B and the transfer-out dedicated load lock chamber 40C are made possible by the use of the robot 64'. The aligner may be provided on the platen device 10.

Figure 17:
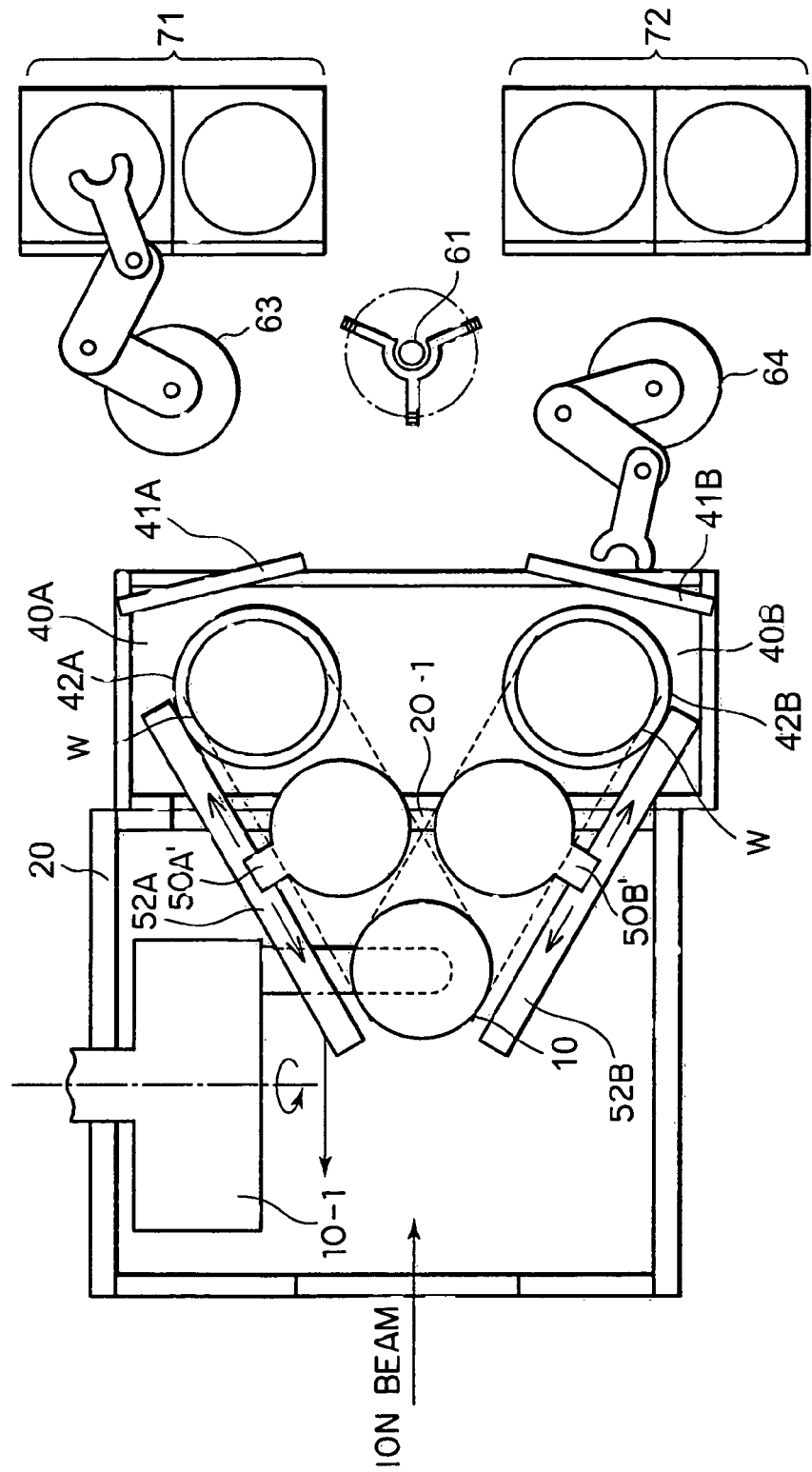
FIG. 17 is a diagram showing a schematic structure of still another embodiment of a wafer processing system according to this invention.

FIG. 17 shows a schematic structure of still another embodiment of a wafer processing system according to this invention. In this embodiment, wafer retaining arms 50A' and 50B' are reciprocatingly movable between the load lock pedestal 42A and the platen device 10 and between the load lock pedestal 42B and the platen device 10 by the use of liner motion mechanisms 52A and 52B, respectively. When crossing the wafer retaining arms 50A' and 50B' each other at different levels for performing transfer-out and transfer-in of a processed wafer and an unprocessed wafer with respect to the platen, one of them may be set higher than the other and mechanisms for vertically driving them may be provided. The other structure is the same as that of the foregoing embodiment.

This invention is applicable to any beam cross-sectional shape among circular, elliptical, oval, and so on.

The wafer processing system according to this invention comprises two robots installed on the atmosphere side and at least two load lock chambers. Further, corresponding to the at least two load lock chambers, two wafer retaining arms are provided on the vacuum chamber side so as to be operable independently of each other. The two wafer retaining arms are reciprocatingly movable while crossing with an overpass each other at different levels. With this configuration, the wafer processing capability can be largely improved as compared with the wafer processing system having the single load lock chamber and the single I-shaped wafer retaining arm.

The wafer processing system according to this invention is suitable for, in addition to an ion implantation system, a wafer transfer system in an in-vacuum processing system such as an X-ray exposure system, particularly a wafer transfer system in a system that requires high-speed processing.

What is claimed is:

1. A wafer processing system for processing a subject wafer retained by a platen device installed in a vacuum process chamber, comprising:

first and second load lock chambers each having a load lock pedestal provided adjacent to said vacuum process chamber through a vacuum intermediate chamber, a single passage opening provided between said vacuum process chamber and said vacuum intermediate chamber, first and second wafer retaining arms installed by first and second rotation axes between said platen device in said vacuum process chamber, first and second load lock pedestals installed in said first and second load lock chambers, and a controller configured to move said first and second wafer retaining arms in a vertical direction along said first and second rotation axes and on the same turning radius with said first and second rotation axes, and configured to normally or reversely rotate said first and second wafer retaining arms at the same instant between the corresponding first and second load lock pedestals and said platen device, while passing a segment that connects between said first and second rotation axes of said first and second wafer retaining arms to make inward rotation motions, and configured to pass said first and second wafer retaining arms through said single passage opening and overpass each other at different levels with normally and reversely rotations thereof, wherein said controller is configured such that one of said first and second wafer retaining arms retains a processed wafer and transfers the processed wafer from said platen device to the corresponding load lock pedestal and such that the other wafer retaining arm retains an unprocessed wafer and transfers the unprocessed wafer from the corresponding load lock pedestal to said platen device, wherein the controller is configured to transfer both of said processed wafer and said unprocessed wafer at the same instant with normally and reversely rotating of said first and second wafer retaining arms, wherein the controller is configured to maintain vertical positions of said first and second wafer retaining arms with holding said processed wafer and said unprocessed wafer at heights that do not interfere with each other, wherein the controller is configured such that when said first and second wafer retaining arms rotate normally and reversely each other at the same instant, one of said processed wafer and said unprocessed wafer held by said first and second wafer retaining arms overlaps the other, wherein the controller is configured to rotate each of said first and second wafer retaining arms normally or reversely between the corresponding load lock pedestal and said platen device by making a rotational motion on the rotation axis, and wherein said rotation axes of said first and second wafer retaining arms are set at different positions which are apart from each other by a distance longer than a length of each of said first and second wafer retaining arms.

2. A wafer processing system for processing a subject wafer retained by a platen device installed in a vacuum process chamber, comprising:

first and second load lock chambers each having a load lock pedestal provided adjacent to said vacuum process chamber through a vacuum intermediate chamber, a single passage opening is provided between said vacuum process chamber and said vacuum intermediate chamber, first and second wafer retaining arms installed by first and second rotation axes between said platen device in said vacuum process chamber, first and second load lock pedestals installed in said first and second load lock chambers, and a controller configured to move said first and second wafer retaining arms in a vertical direction along said first and second rotation axes and on the same turning radius with said first and second rotation axes, and configured to normally or reversely rotate said first and second wafer retaining arms at the same instant between the corresponding first and second load lock pedestals and said platen device, while passing through a segment that connects between said first and second rotation axes of said first and second wafer retaining arms to make inward rotational motions, and configured to pass said first and second wafer retaining arms through said single passage opening and overpass each other at different levels with normally and reversely rotations thereof, wherein a vacuum exhaustion and ventilation mechanism is provided in each of said load lock chambers, wherein said controller is configured such that one of said first and second wafer retaining arms retains a processed wafer and transfers the processed wafer in a vacuum state from said platen device to the corresponding load lock pedestal and such that the other wafer retaining arm retains an unprocessed wafer and transfers the unprocessed wafer in a vacuum state from the corresponding load lock pedestal to said platen device, wherein the controller is configured to transfer both of said processed wafer and said unprocessed wafer at the same instant with normally and reversely rotating of said first and second wafer retaining arms, wherein the controller is configured to maintain vertical positions of said first and second wafer retaining arms with holding said processed wafer and said unprocessed wafer at heights that do not interfere with each other and, wherein the controller is configured such that when said first and second wafer retaining arms rotate normally and reversely each other at the same instant, one of said processed wafer and said unprocessed wafer held by said first and second wafer retaining arms overlaps the other, wherein the controller is configured to rotate each of said first and second wafer retaining arms normally or reversely between the corresponding load lock pedestal and said platen device by making a rotational motion on the rotation axis, and wherein said rotation axes of said first and second wafer retaining arms are set at different positions which are apart from each other by a distance longer than a length of each of said first and second wafer retaining arms.

3. A wafer processing system according to claim 1 or 2, wherein each of said load lock chambers has a door member that is opened and closed when an unprocessed wafer or a processed wafer is taken in or out with the load lock chamber by wafer transfer robots, and said load lock pedestal is a vertically movable load lock pedestal and has a lock plate serving for opening and closing between the subject load lock chamber and said vacuum intermediate chamber.

4. A wafer processing system according to claim 3, wherein while said load lock chambers are closed by said lock plates by upward movement of said load lock pedestals, said first and second wafer retaining arms are in a standby state in said vacuum intermediate chamber.

5. A wafer processing system according to claim 1 or 2, wherein when receiving the processed wafer from said platen device and delivering the unprocessed wafer to said platen device, said first and second wafer retaining arms rotate normally or reversely at the same instant between the corresponding load lock pedestals and said platen device while crossing with an overpass each other at the different levels by making inward rotational motions on the rotation axes, respectively.

6. A wafer processing system according to claim 1 or 2, further comprising, outside said vacuum process chamber, two robots for wafer transfer installed corresponding to said first and second load lock chambers, an aligner for wafer positioning installed between said two robots, and at least one cassette station for accommodating wafers, wherein one of said first and second load lock chambers is exclusively used for transfer of an unprocessed wafer carried out by the corresponding one of said robots and the other load lock chamber is exclusively used for transfer of a processed wafer carried out by the corresponding other robot, and wherein transfer of an unprocessed wafer to said aligner is alternately carried out by one and other of said two robots so that while said one robot transfers an unprocessed wafer to said one load lock chamber, said other robot transfers a next unprocessed wafer to said aligner and, while said other robot transfers a processed wafer from said other load lock chamber, stores the processed wafer into said cassette station, takes out a next unprocessed wafer from said cassette station, and transfers the next unprocessed wafer to said aligner, said one robot retains the next unprocessed wafer on said aligner and waits.

7. A wafer processing system according to claim 2, wherein said vacuum exhaustion and ventilation mechanism of each load lock chamber is provided with a slow speed vacuum exhaustion and slow speed ventilation mechanism.

8. A wafer processing system for processing a subject wafer retained by a platen device installed in a vacuum process chamber, comprising:

a first, a second, and a third load lock chamber each having a load lock pedestal provided adjacent to said vacuum process chamber through a vacuum intermediate chamber, and a single passage opening provided between said vacuum process chamber and said vacuum intermediate chamber, wherein said first and second load lock chambers are configured to be exclusively used for transfer-in of unprocessed wafers via a controller, wherein said third load lock chamber is installed between said first and second load lock chambers and configured to exclusively transfer-out a processed wafer, wherein said third load lock chamber has a door member configured to open and close when a processed wafer is taken out, and said load lock pedestal is a vertically movable load lock pedestal and has a lock plate configured to open and close between said third load lock chamber and said vacuum intermediate chamber, wherein said controller is configured such that while one of first and second wafer retaining arms transfers an unprocessed wafer from the corresponding load lock pedestal to said platen device, the other wafer retaining arm transfers a processed wafer from said platen device to the transfer-out dedicated load lock pedestal and, while said other wafer retaining arm transfers an unprocessed wafer from the corresponding load lock pedestal to said platen device, said one of wafer retaining arms transfers a processed wafer from said platen device to the transfer-out dedicated load lock pedestal, wherein said first and second wafer retaining arms are installed by first and second rotation axes between said platen device in said vacuum process chamber and first and second load lock pedestals installed in said first and second load lock chambers, wherein the controller is configured to move said first and second wafer retaining arms in a vertical direction along said first and second rotation axes and on the same turning radius with said first and second rotation axes, and configured to normally or reversely rotate said first and second retaining arms at the same instant between the corresponding first and second load lock pedestals and said platen device, while passing through a segment that connects between said first and second rotation axes of said first and second wafer retaining arms to make inward rotational motions, and configured to pass said first and second wafer retaining arms through said single passage opening and overpass each other at different levels with normally and reversely rotations thereof, wherein the controller is configured to maintain vertical positions of said first and second wafer retaining arms with holding said processed wafer and said unprocessed wafer at heights that do not interfere with each other, wherein the controller is configured such that when said first and second wafer retaining arms rotate normally and reversely each other at the same instant, one of said processed wafer and said unprocessed wafer held by said first and second wafer retaining arms overlaps the other, wherein the controller is configured to rotate each of said first and second wafer retaining arms normally or reversely between the corresponding load lock pedestal and said platen device by making a rotation motion on the rotation axis, and wherein said rotation axes of said first and second wafer retaining arms are set at different positions which are apart from each other by a distance longer than a length of each of said first and second wafer retaining arms.

9. A wafer processing system according to claim 8, further comprising, outside said vacuum process chamber, at least one robot for wafer transfer and a plurality of cassette stations for accommodating unprocessed wafers and processed wafers, wherein said at least one robot comprises an aligner for wafer positioning and is movable along said first to third load lock chambers so as to be capable of the transfer-in of the unprocessed wafers and the transfer-out of the processed wafer with respect to said transfer-in dedicated load lock chambers and said transfer-out dedicated load lock chamber.

10. An ion implantation system comprising the wafer processing system according to any one of claims 1, 2, and 8.

* * * * *